(12) United States Patent
Choi et al.

(10) Patent No.: US 12,720,750 B2
(45) Date of Patent: Aug. 25, 2026

(54) SEMICONDUCTOR DEVICE AND METHOD FOR MANUFACTURING THE SAME, AND ELECTRONIC SYSTEM INCLUDING SEMICONDUCTOR DEVICE

(71) Applicant: Samsung Electronics Co., Ltd., Suwon-si (KR)

(72) Inventors: Daehwan Choi, Suwon-si (KR); Hyuk Kim, Suwon-si (KR); Chanju Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 339 days.

(21) Appl. No.: 18/392,254

(22) Filed: Dec. 21, 2023

(65) Prior Publication Data

US 2025/0008731 A1 Jan. 2, 2025

(30) Foreign Application Priority Data

Jun. 30, 2023 (KR) ........................ 10-2023-0085269

(51) Int. Cl.
*H10B 43/27* (2023.01)

(52) U.S. Cl.
CPC .................................... *H10B 43/27* (2023.02)

(58) Field of Classification Search
CPC ........ H10B 43/27; H10B 43/10; H10B 43/50; H10B 43/40; H10W 20/081; H10W 20/435
See application file for complete search history.

(56) References Cited

U.S. PATENT DOCUMENTS

| | | | |
|---|---|---|---|
| 8,574,992 | B2 | 11/2013 | Chen et al. |
| 9,236,392 | B1 | 1/2016 | Izumi et al. |
| 9,276,009 | B2 | 3/2016 | Chen |
| 9,337,207 | B2 | 5/2016 | Park et al. |
| 9,911,750 | B2 | 3/2018 | Lee |
| 10,403,500 | B2 | 9/2019 | Lee |
| 10,608,013 | B1 | 3/2020 | Xiao |
| 11,342,353 | B2 | 5/2022 | Oh et al. |
| 2011/0316072 | A1 | 12/2011 | Lee |
| 2013/0075802 | A1 | 3/2013 | Chen et al. |
| 2014/0197546 | A1 | 7/2014 | Hwang et al. |
| 2014/0306279 | A1 | 10/2014 | Park et al. |
| 2015/0255468 | A1 | 9/2015 | Chen |

(Continued)

*Primary Examiner* — S M Sohel Imtiaz
(74) *Attorney, Agent, or Firm* — Harness, Dickey & Pierce, P.L.C.

(57) ABSTRACT

A semiconductor device includes a cell array region, a contact region, a gate stack structure, a channel structure extending through the gate stack structurem, and gate contact portions connected to respective gate electrodes. At least some of the gate contact portions extend through a through gate electrode to a connection gate electrode. The gate contact portions include contact groups extending from a first side to a second side of the gate electrodes. Each of the electrode groups includes an upper group on a lower group. Each of the contact groups includes a first group connected to the upper group and a second group on the second side connected to the lower group, and a number of layers of the connection gate electrodes to which the gate contact portions are connected sequentially increases as a distance from a boundary between the first group and the second group increases.

18 Claims, 22 Drawing Sheets

(56) References Cited

U.S. PATENT DOCUMENTS

| | | | | |
|---|---|---|---|---|
| 2018/0286678 | A1* | 10/2018 | Lee | H10P 14/40 |
| 2020/0098781 | A1 | 3/2020 | Xiao | |
| 2021/0013304 | A1* | 1/2021 | Ryu | H10B 43/10 |
| 2021/0036007 | A1 | 2/2021 | Oh et al. | |
| 2021/0265388 | A1* | 8/2021 | Baek | H10B 43/10 |
| 2021/0288054 | A1* | 9/2021 | Ryu | H10B 43/10 |
| 2022/0093639 | A1* | 3/2022 | Song | H10B 41/50 |
| 2022/0375888 | A1* | 11/2022 | Choi | H10B 41/27 |
| 2022/0384478 | A1* | 12/2022 | Son | H10B 43/10 |
| 2023/0326891 | A1* | 10/2023 | Park | H10W 90/00<br>257/777 |
| 2024/0268113 | A1* | 8/2024 | Chun | H10B 43/50 |

* cited by examiner 2500
2210
2400
2100
I
2130
2003
I'
3210
3220
2200
2300
2003a
2003b
2003
2005
2001
2002
2004
2006
2000

SEMICONDUCTOR DEVICE AND METHOD FOR MANUFACTURING THE SAME, AND ELECTRONIC SYSTEM INCLUDING SEMICONDUCTOR DEVICE

CROSS-REFERENCE TO RELATED APPLICATION

This application claims priority to and the benefit of Korean Patent Application No. 10-2023-0085269, filed in the Korean Intellectual Property Office on Jun. 30, 2023, the entire contents of which are incorporated herein by reference.

BACKGROUND

1. Field

The present disclosure relates to a semiconductor device, a manufacturing method thereof, and/or an electronic system including the semiconductor device.

2. Description of the Related Art

A semiconductor is a material belonging to an intermediate region between a conductor and an insulator, and refers to a material that conducts electricity under a predetermined condition. Various semiconductor devices can be manufactured by using such a semiconductor material, and for example, a memory device and the like can be manufactured. Memory devices may be classified into volatile memory devices and non-volatile memory devices. In the case of a non-volatile memory device, contents may not be deleted even if power is cut off, and may be used in various electronic devices such as mobile phones, digital cameras, and PCs.

In accordance with recent trend of increasing storage capacity, a degree of integration of non-volatile memory devices is required to be improved. The degree of integration of memory devices two-dimensionally arranged on a plane may be limited. Accordingly, a vertical non-volatile memory device arranged in three dimensions has been proposed.

SUMMARY

Some example embodiments provide a semiconductor device, a manufacturing method thereof, and/or a data storage system including the semiconductor device, capable of improving reliability and productivity.

An example embodiment of the present disclosure provides a semiconductor device including: a substrate configured to include a cell array region and a contact region; a gate stack structure configured to include a plurality of gate electrodes constituting a plurality of electrode groups sequentially stacked on the substrate and insulated by an interlayer insulating layer; a channel structure configured to extend in a direction crossing the substrate through the gate stack structure in the cell array region; and a plurality of gate contact portions connected to respective gate electrodes in the contact region, wherein at least some of the gate contact portions extend through a through gate electrode that is at least one of the gate electrodes and is connected to a connection gate electrode at a lower end portion, and the gate contact portions include a plurality of contact groups extending from a first side to a second side of the gate electrodes in an extending direction, and wherein each of the electrode groups includes a lower group and an upper group on the lower group, each of the contact groups includes a first group connected to the upper group and a second group on the second side in the extending direction and connected to the lower group, and a number of layers of the connection gate electrodes to which the gate contact portions are connected sequentially increases as a distance from a boundary between the first group and the second group increases in the first group and the second group.

An example embodiment of the present disclosure provides an electronic system of a semiconductor device including: a main substrate; a semiconductor device on the main substrate; and a controller electrically connected to the semiconductor device on the main substrate, wherein the semiconductor device includes a circuit region configured to include a peripheral circuit structure and a cell region on the circuit region and configured to include a cell array region and a contact region, and includes: a substrate configured to include a cell array region and a contact region; a gate stack structure configured to include a plurality of gate electrodes constituting a first electrode group and a second electrode group sequentially stacked on the substrate and insulated by an interlayer insulating layer; a channel structure configured to extend in a direction crossing the substrate through the gate stack structure in the cell array region; and a plurality of gate contact portions connected to respective gate electrodes in the contact region, wherein at least some of the gate contact portions extend through a through gate electrode that is at least one of the gate electrodes and is connected to a connection gate electrode at a lower end portion, and the gate contact portions include a plurality of contact groups extending from a first side to a second side of the gate electrodes in an extending direction, and wherein each of the electrode groups includes a lower group and an upper group on the lower group, each of the contact groups includes a first group connected to the upper group and a second group on the second side in the extending direction and connected to the lower group, and a number of layers of the connection gate electrodes to which the gate contact portions are connected sequentially increases as a distance from a boundary between the first group and the second group increases in the first group and the second group.

An example embodiment of the present disclosure provides a manufacturing method of a semiconductor device, including: forming a stack structure by forming sacrificial insulating layers and interlayer insulating layers that are alternately stacked; forming a plurality of preliminary contact groups including a first zone and a second zone on an upper sacrificial insulating layer group by sequentially forming a plurality of preliminary patterns using a first mask pattern; forming a plurality of contact holes by sequentially forming an extension in the preliminary contact groups using a second mask pattern that sequentially exposes the preliminary contact groups in a zone unit corresponding to the first zone or the second zone; forming a gate spacer in the contact holes; removing the sacrificial insulating layer and forming a gate electrode in the removed region; and etching a lower surface of the gate spacer and forming a plurality of gate contact portions filling the contact holes.

According to the example embodiments, in a process of forming a contact hole of a semiconductor device, a plurality of preliminary contact groups having symmetrical connection structures may be simultaneously formed in each zone. Accordingly, the process may be easily controlled and simplified.

In addition, a plurality of preliminary contact groups formed in each region may be etched together by a unit number. Accordingly, contact holes having a same connection structure are formed in each area, thereby reducing an error margin between contact holes and improving dispersion. Accordingly, reliability and productivity of the semiconductor device may be improved.

DETAILED DESCRIPTION

Figure 1:
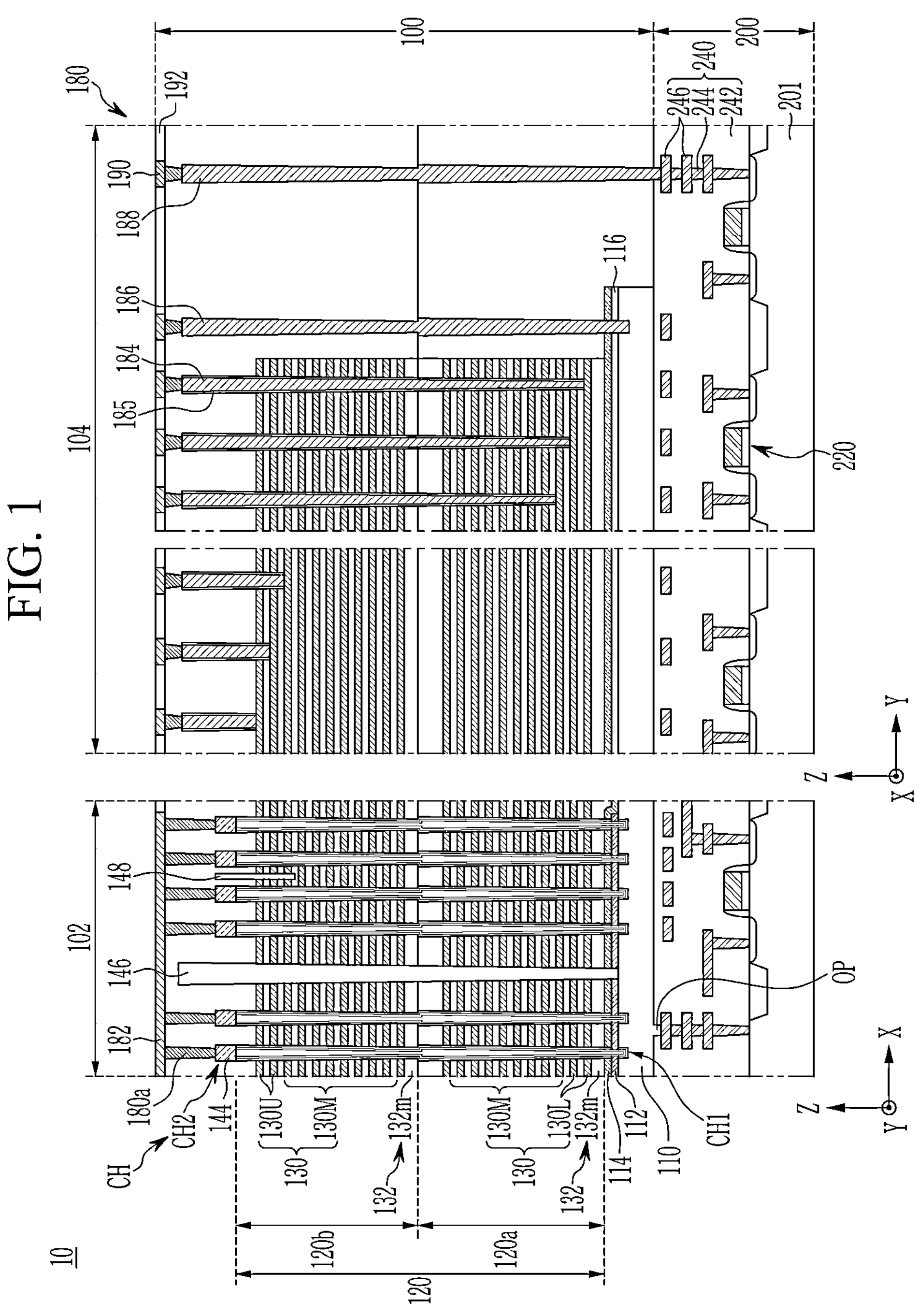
FIG. 1 illustrates a cross-sectional view showing a semiconductor device according to an example embodiment.

The present disclosure will be described more fully hereinafter with reference to the accompanying drawings, in which example embodiments of the disclosure are shown. As those skilled in the art would realize, the described example embodiments may be modified in various different ways, all without departing from the spirit or scope of the present disclosure.

To clearly describe the present invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

Hereinafter, a semiconductor device according to an example embodiment will be described with reference to FIG. 1, FIG. 2A, and FIG. 2B.

Figure 2A:
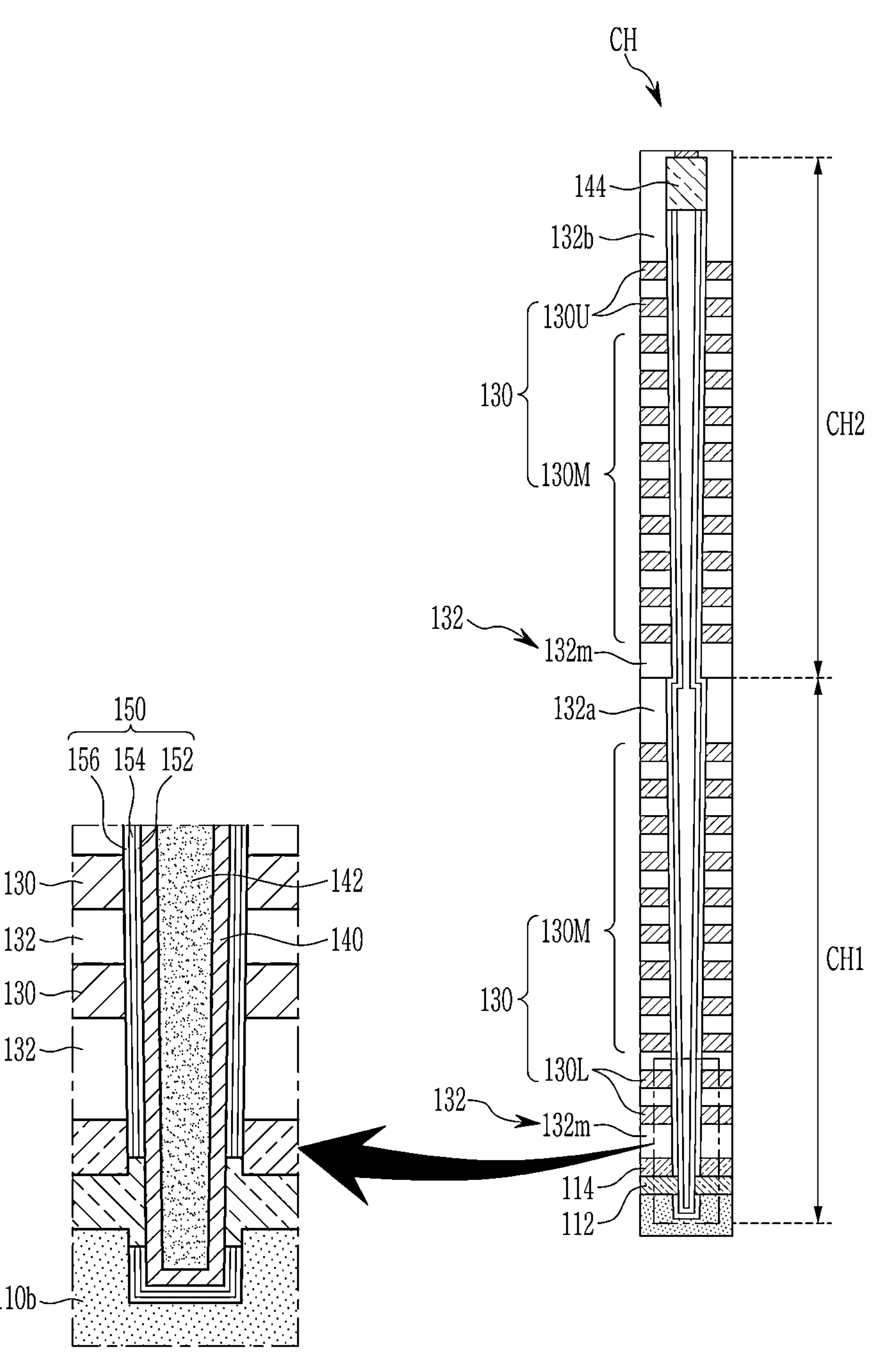
FIG. 2A and FIG. 2B illustrate cross-sectional views showing various examples of a channel structure included in the semiconductor device illustrated in FIG. 1.
Figure 2B:
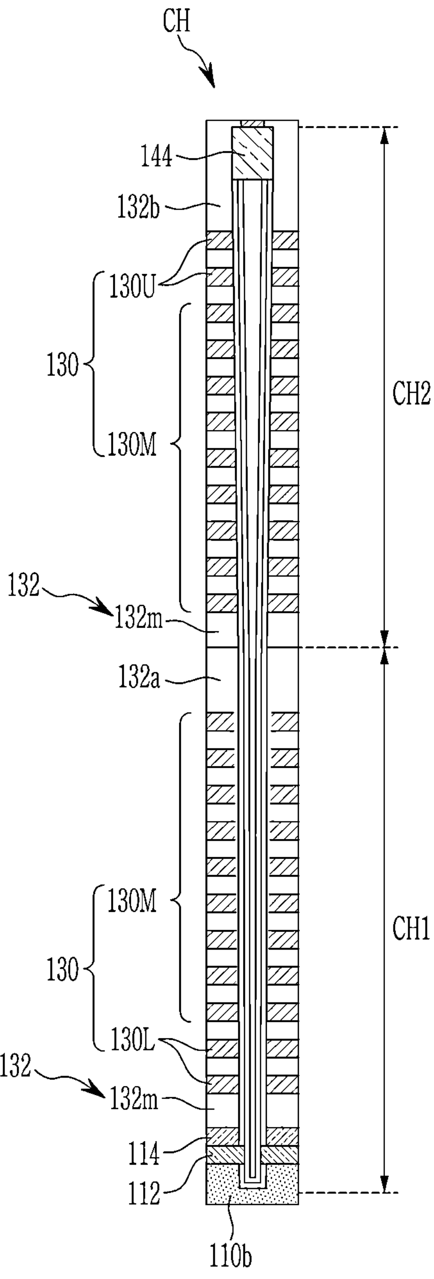

FIG. 1 illustrates a cross-sectional view showing a semiconductor device according to an example embodiment, and FIG. 2A and FIG. 2B illustrate cross-sectional views showing various examples of a channel structure included in the semiconductor device illustrated in FIG. 1.

Referring to FIG. 1 and FIG. 2A, a semiconductor device 10 according to an example embodiment includes a cell region 100 including a memory cell structure and a circuit region 200 including a peripheral circuit structure for controlling an operation of the memory cell structure. For example, the circuit region 200 and the cell region 100 may respectively be portions corresponding to a first structure 1100F and a second structure 1100S of a semiconductor device 1100 included in an electronic system 1000 illustrated in FIG. 18. Alternatively, the circuit region 200 and the cell region 100 may respectively be portions corresponding to a first structure 3100 or 4100 and a second structure 3200 or 4200 of a semiconductor chip 2200 illustrated in FIG. 20 or 21.

Herein, the circuit region 200 may include a peripheral circuit structure positioned on a first substrate 201, and the cell region 100 may include a gate stack structure 120 and a channel structure CH positioned on a cell array region 102 of the second substrate 110 as a memory cell structure. A first wire portion 240 electrically connected to the peripheral circuit structure may be positioned in the circuit region 200, and a second wire portion 180 electrically connected to the memory cell structure may be positioned in the cell region 100.

In an example embodiment, the cell region 100 may be positioned on the circuit region 200. Accordingly, since an area corresponding to the circuit region 200 does not need to be secured separately from the cell region 100, an area of the semiconductor device 10 may be reduced. However, the example embodiment is not limited thereto, and the circuit region 200 may be positioned next to the cell region 100. Various other changes are possible.

The circuit region 200 may include the first substrate 201 and a circuit element 220 and the first wire portion 240 positioned on the first substrate 201.

The first substrate 201 may be a semiconductor substrate including a semiconductor material. For example, the first substrate 201 may be a semiconductor substrate made of a semiconductor material or may be a semiconductor substrate on which a semiconductor layer is formed on a base substrate. For example, the first substrate 201 may include, e.g., silicon, epitaxial silicon, germanium, silicon-germanium, silicon-on-insulator (SOI), or germanium on insulator (GOI).

The circuit element 220 disposed on the first substrate 201 may include various circuit elements that control the operation of the memory cell structure provided in the cell region 100. For example, the circuit element 220 may configure peripheral circuit structures such as a decoder circuit (reference numeral 1110 in FIG. 18), a page buffer (reference numeral 1120 in FIG. 18), and a logic circuit (reference numeral 1130 in FIG. 18).

The circuit element 220 may include, e.g., a transistor, but the present disclosure is not limited thereto. For example, the circuit element 220 may include not only active elements such as transistors, but also passive elements such as capacitors, resistors, and inductors.

The first wire portion 240 positioned on the first substrate 201 may be electrically connected to the circuit element 220. In an example embodiment, the first wire portion may include a plurality of wiring layers 246 spaced apart with a first wire insulating layer 242 provided therebetween and connected to form a desired path by a contact via 244. The wiring layer 246 or the contact via 244 may include various conductive materials, and the first wire insulating layer 242 may include various insulating materials.

The cell region 100 may include the cell array region 102 and a contact region 104. The gate stack structure 120 and the channel structure CH may be positioned on the second substrate 110 in the cell array region 102. In the contact region 104, the gate stack structure 120 on the second substrate 110, the gate contact portions 184 for connecting the gate stack structure 120 of the cell array region 102 to the circuit region 200 or an external circuit, and/or a structure for connecting the channel structure CH to the circuit region 200 or an external circuit may be positioned.

In an example embodiment, the second substrate 110 may include a semiconductor material. For example, the second substrate 110 may include polysilicon doped with impurities. The second substrate 110 may function as a common source line. The second substrate 110 may function as a source region supplying a current to memory cells positioned on the second substrate 110. The second substrate 110 may be a in a plate shape. That is, the second substrate 110 may be formed as a plate common source line.

At least a portion of the first wire insulating layer 242 may be positioned between the second substrate 110 and the first wire portion 240. A portion of the first wire insulating layer 242 positioned between the second substrate 110 and the first wire portion 240 may be formed of a single layer or multiple layers. For example, a layer containing a silicon nitride and a layer containing a silicon oxide may be positioned between the second substrate 110 and the first wire portion 240. In this case, the layer containing the silicon oxide may be positioned on the layer containing the silicon nitride.

In the cell array region 102, the gate stack structure 120 including cell insulating layers 132 and gate electrodes 130 alternately stacked on the first surface (e.g., a front surface or an upper surface) of the second substrate 110, and the channel structure CH extending in a direction crossing the second substrate 110 through the gate stack structure 120 may be position.

Horizontal conductive layers 112 and 114 may be provided between the second substrate 110 and the gate stack structure 120 in the cell array region 102. The horizontal conductive layers 112 and 114 may serve to electrically connect the channel structure CH and the second substrate 110. For example, the horizontal conductive layers 112 and 114 may include a first horizontal conductive layer 112 positioned on the first surface of the second substrate 110, and may further include a second horizontal conductive layer 114 positioned on the first horizontal conductive layer 112. That is, the first horizontal conductive layer 112 may be disposed between the second substrate 110 and the second horizontal conductive layer 114. The first horizontal conductive layer 112 may not be provided and a horizontal insulating layer 116 may be provided between the second substrate 110 and the gate stack structure 120 in a portion of the contact region 104. In a manufacturing process, a portion of the horizontal insulating layer 116 may be replaced with the first horizontal conductive layer 112, and another portion of the horizontal insulating layer 116 located in the contact region 104 may remain in the contact region 104.

The first horizontal conductive layer 112 may function as a portion of a common source line of the semiconductor device 10. For example, the first horizontal conductive layer 112 and the second substrate 110 may function as the common source line. As illustrated in the enlarged view of FIG. 2A, the channel structure CH may extend to the second substrate 110 through the horizontal conductive layers 112 and 114, and the gate dielectric layer 150 may be removed from a portion where the first horizontal conductive layer 112 is positioned so that the first horizontal conductive layer 112 may be directly connected to a channel layer 140 around the channel layer 140. Accordingly, the first horizontal conductive layer 112 may electrically connect the second substrate 110 and the channel layer 140 to each other.

The first and second horizontal conductive layers 112 and 114 may include a semiconductor material (e.g., polycrystalline silicon). For example, the first horizontal conductive layer 112 may be polycrystalline silicon doped with impurities, and the second horizontal conductive layer 114 may be polycrystalline silicon doped with impurities or a layer including impurities diffused from the first horizontal conductive layer 112. However, the example embodiment is not limited thereto, and the second horizontal conductive layer 114 may include an insulating material. Alternatively, the second horizontal conductive layer 114 may not be provided separately.

The gate stack structure 120 in which the cell insulating layers 132 and the gate electrodes 130 are alternately stacked may be positioned on the second substrate 110 (e.g., on the first and second horizontal conductive layers 112 and 114 disposed on the second substrate 110).

In an example embodiment, the gate stack structure 120 may include a plurality of gate stack structures 120*a* and 120*b* sequentially stacked on the second substrate 110. Then, since a number of stacked gate electrodes 130 may be increased, a number of memory cells may be increased with a stable structure. For example, the gate stack structure 120 includes the first and second gate stack structures 120*a* and 120*b*, thereby increasing data storage capacity and simplifying the structure. However, the example embodiment is not limited thereto, and the gate stack structure 120 may include one gate stack structure or three or more gate stack structures.

In the gate stack structure 120, the gate electrode 130 may include a lower gate electrode 130L, a memory cell gate electrode 130M, and an upper gate electrode 130U sequentially positioned on the second substrate 110. The lower gate electrode 130L may be used as a gate electrode of a ground select transistor, the memory cell gate electrode 130M may constitute a memory cell, and the upper gate electrode 130U may be used as a gate electrode of a string select transistor. A number of memory cell gate electrodes 130M may be determined according to data storage capacity of the semiconductor device 10. According to an example embodiment, one or two or more lower gate electrodes 130L and upper gate electrodes 130U may be provided, and it may have a same structure as that of the memory cell gate electrode 130M or a different structure. A portion of the gate electrode 130, e.g., the memory cell gate electrode 130M adjacent to the lower gate electrode 130L and the upper gate electrode 130U may be a dummy gate electrode.

The cell insulating layers 132 may include an interlayer insulating layer 132*m* positioned below the gate electrode 130 or between two adjacent gate electrodes 130 in first and second gate stack structures 120*a* and 120*b*, and upper insulating layers 132*a* and 132*b* positioned at upper portions of the first and second gate stack structures 120*a* and 120*b*. For example, the upper insulation layers 132*a* and 132*b* may include a first upper insulating layer 132*a* positioned at an upper portion of the first gate stack structure 120*a*, and a second upper insulating layer 132*b* positioned at upper portion of the second gate stack structure 120*b*. In this case, the first upper insulating layer 132*a* is an intermediate insulating layer positioned between the first gate stack structure 120*a* and the second gate stack structure 120*b*, and the second upper insulating layer 132*b* is an uppermost insulating layer positioned at an uppermost portion of the gate stack structure 120. The second upper insulating layer 132*b* may form part or all of a cell region insulating layer positioned at an entire upper portion of the cell region 100. In an example embodiment, thicknesses of the cell insulating layers 132 may not all be the same. For example, the thicknesses of the upper insulating layers 132*a* and 132*b* may be greater than the thickness of the interlayer insulating layer 132*m*. However, a shape and structure of the cell insulating layer 132 may be variously changed according to another example embodiment.

For simplicity of illustration, the cell insulating layer 132 in the contact region 104 has a boundary between the first stack structure 120*c* and the second stack structure 120*d*. However, the example embodiment is not limited thereto. In the contact region 104, a plurality of insulating layers may have various stack structures, and the example embodiment is not limited thereto.

The gate electrode 130 may include various conductive materials. For example, the gate electrode 130 may include a metal material such as tungsten (W), copper (Cu), or aluminum (Al). As another example, the gate electrode 130 may include polycrystalline silicon, a metal nitride (e.g., titanium nitride (TiN), tantalum nitride (TaN), or the like), or a combination thereof. Although not illustrated, outside the gate electrode 130, an insulating film made of an insulating material may be positioned, or a portion of the gate dielectric layer 150 may be positioned. The cell insulating layer 132 may include various insulating materials. For example, the cell insulating layer 132 may include a silicon oxide, a silicon nitride, a silicon oxynitride, a low dielectric constant material having lower permittivity than that of the silicon oxide, or a combination thereof.

In an example embodiment, the channel structure CH may extend through the gate stack structure 120 and intersect the second substrate 110 in a direction (for example, a vertical direction perpendicular to the second substrate 110) (Z-axis direction in the drawing).

More specifically, the channel structure CH may include a channel layer 140 and a gate dielectric layer 150 positioned on the channel layer 140 between the gate electrode 130 and the channel layer 140. The channel structure CH may further include a core insulating layer 142 disposed inside the channel layer 140, and a channel pad 144 positioned on the channel layer 140 and/or the gate dielectric layer 150.

Each channel structure CH forms one memory cell string, and a plurality of channel structures CH may be spaced apart from each other while forming rows and columns in a plan view. For example, the channel structures CH may be arranged in various forms such as a lattice form or a zigzag form in a plan view. The channel structures CH may each have a columnar shape. For example, when the channel structure CH is viewed in a cross-sectional view, it may have an inclined side surface such that its width narrows as it approaches the second substrate 110 according to an aspect ratio. However, the example embodiment is not limited thereto, and the arrangement, structure, and form of the channel structure CH may be variously changed.

The core insulating layer 142 may be provided in a central region of the channel structure CH, and the channel layer 140 may be formed while surrounding sidewalls of the core insulating layer 142. For example, the core insulating layer 142 may have a columnar shape (e.g., a cylindrical shape or a polygonal columnar shape), and the channel layer 140 may have a planar shape such as an annular shape. However, the example embodiment is not limited thereto, and the core insulating layer 142 may not be provided and the channel layer 140 may have a columnar shape (e.g., a cylindrical shape or a polygonal columnar shape).

The channel layer 140 may include a semiconductor material, e.g., polycrystalline silicon. The core insulating layer 142 may include various insulating materials. For example, the core insulating layer 142 may include a silicon oxide, a silicon nitride, a silicon oxynitride, or a combination thereof. However, materials of the channel layer 140 and the core insulating layer 142 are not limited thereto.

The gate dielectric layer 150 positioned between the gate electrode 130 and the channel layer 140 may include a tunneling layer 152, a charge storage layer 154, and a blocking layer 156 sequentially stacked on the channel layer 140.

In this case, the tunneling layer 152 is a layer through which charges are tunneled according to a voltage applied to the gate electrode 130, and may include an insulating material capable of tunneling charges. The tunneling layer 152 may include a material such as a silicon oxide or a silicon nitride. For example, the tunneling layer 152 may be formed by stacking a layer including a silicon oxide and a layer including a silicon nitride.

The charge storage layer 154 disposed between the tunneling layer 152 and the blocking layer 156 may be used as a data storage region. For example, the charge storage layer 154 may include a silicon nitride capable of trapping charges. If the charge storage layer 154 is made of a silicon nitride, it may have relatively excellent retention, and may be advantageous for integration, compared to the case made of polysilicon. However, the material of the charge storage layer 154 is not limited thereto.

The blocking layer 156 may be disposed between the charge storage layer 154 and the gate electrode 130. The blocking layer 156 may include an insulating material capable of preventing an undesirable flow of charges into the gate electrode 130. For example, the blocking layer 156 may include a silicon oxide, a silicon nitride, a silicon oxynitride, a high dielectric constant material, or a combination thereof.

Herein, the high dielectric constant material indicates a dielectric material having higher permittivity than that of the silicon oxide. For example, the high dielectric constant material may include, e.g., an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or a combination thereof.

A channel pad 144 may be disposed on the channel layer 140 and/or the gate dielectric layer 150. The channel pad 144 may be positioned to cover an upper surface of the core insulating layer 142 and to be electrically connected to the channel layer 140. Although the channel pad 144 is illustrated to cover an upper surface of the gate dielectric layer 150, the present disclosure is not limited thereto. For example, the channel pad 144 may not cover the upper surface of the gate dielectric layer 150. In this case, a side surface of the channel pad 144 may be surrounded by the gate dielectric layer 150. The side surface of the channel pad 144 may contact the tunneling layer 152. The channel pad 144 may include a conductive material, e.g., polysilicon doped with impurities. However, a material of the channel pad 144 is not limited thereto, and may be variously changed.

As described above, if the gate stack structure 120 includes a plurality of gate stack structures 120*a* and 120*b* stacked on each other, the channel structure CH may include a plurality of channel structures CH1 and CH2 extending through the gate stack structures 120*a* and 120*b*, respectively. For example, if a plurality of gate stack structures 120 include a first gate stack structure 120*a* and a second gate stack structure 120*b*, a plurality of channel structures CH may include a first channel structure CH1 extending through the first gate stack structure 120*a* and a second channel structure CH2 extending through the second gate stack structure 120*b*.

The first channel structure CH1 and the second channel structure CH2 may have forms connected to each other. Each of the first channel structure CH1 and the second channel structure CH2 may have an inclined side surface such that its width becomes narrower closer to the second substrate 110 according to an aspect ratio when viewed in a cross-sectional view. As illustrated in FIG. 2A, a bent portion may be provided due to a difference in width at a portion where the first channel structure CH1 and the second channel structure CH2 are connected. As another example, as illustrated in FIG. 2B, the first channel structure CH1 and the second channel structure CH2 may have inclined side surfaces continuously connected without a bent portion. However, shapes of the first channel structure CH1 and the second channel structure CH2 are not limited thereto, and may be variously changed.

In FIG. 1, an integral structure formed by extending the gate dielectric layer 150, the channel layer 140, and the core insulating layer 142 of the first channel structure CH1 and the second channel structure CH2 is illustrated. After forming a first through portion for the first channel structure CH1 and a second through portion for the second channel structure CH2, the above-described structure may be formed by forming the gate dielectric layer 150, the channel layer 140, and the core insulating layer 142 over the first and second through portions. However, the example embodiment is not limited thereto. As another example, the gate dielectric layer 150, the channel layer 140, and the core insulating layer 142 of the first channel structure CH1 and the second channel structure CH2 may be separately formed to be electrically connected to each other. For example, after forming the first through portion for the first channel structure CH1, the gate dielectric layer 150, the channel layer 140, and the core insulating layer 142 may be formed in the first through portion, and after forming the second through portion for the second channel structure CH2, the gate dielectric layer 150, the channel layer 140, and the core insulating layer 142 may be formed in the second through portion. Various other changes are possible.

In an example embodiment, the channel pad 144 may be provided on the gate stack structure 120 positioned at an upper portion among the plurality of gate stack structures 120 (for example, a channel structure CH (e.g., a second channel structure CH2) provided in the second gate stack structure 120*b*). Alternatively, the channel pad 144 may be provided on each of the first channel structure CH1 and the second channel structure CH2. In this case, the channel pad 144 of the first channel structure CH1 may be connected to the channel layer 140 of the second channel structure CH2.

In an example embodiment, the gate stack structure 120 may extend in a direction crossing the second substrate 110 (e.g., a vertical direction, i.e., a Z-axis direction in the drawing) to be partitioned in plural in a plan view by a separating structure 146 extending the gate stack structure 120.

For example, the separating structure 146 may extend to the second substrate 110 through the gate electrode 130 and the cell insulating layer 132. In a plan view, the separating structure 146 may extend in one direction (Y-axis direction in the drawing), and may be provided in plural so as to be spaced apart from each other at a predetermined interval in a crossing direction (X-axis direction in the drawing) crossing the one direction. Accordingly, in a plan view, the gate stack structures 120 may each extend in one direction (Y-axis direction in the drawing) and may be spaced apart from each other at a predetermined interval in the crossing direction (X-axis direction in the drawing). The gate stack structures 120 partitioned by the separating structure 146 may constitute one memory cell block. However, the example embodiment is not limited thereto, and a range of the memory cell block is not limited thereto.

As an example, the separating structure 146 may have an inclined side surface of which width decreases toward the second substrate 110 when viewed in a cross-sectional view due to a high aspect ratio. However, the example embodiment is not limited thereto, and a side surface of the separating structure 146 may be perpendicular to the second substrate 110. In FIG. 1, when viewed in a cross-sectional view, it is illustrated that the separating structure 146 has continuously inclined side surfaces in the first gate stack structure 120*a* and the second gate stack structure 120*b* and does not include a bent portion. However, the example embodiment is not limited thereto, and the separating structure 146 may have a bent portion at a boundary between the first gate stack structure 120*a* and the second gate stack structure 120*b*.

The separating structure 146 may be filled with a variety of insulating materials. For example, the separating structure 146 may include an insulating material such as a silicon oxide, a silicon nitride, or a silicon oxynitride. However, the example embodiment is not limited thereto, and the structure, shape, and material of the separating structure 146 may be variously changed.

An upper separating pattern 148 may be disposed at an upper portion of the gate stack structure 120. In a plan view, the upper separating pattern 148 may extend in one direction (Y-axis direction in the drawing), and may be provided in plural so as to be spaced apart from each other at a predetermined interval in a crossing direction (X-axis direction in the drawing) crossing the one direction.

The upper separating pattern 148 may be disposed by extending through one or a plurality of gate electrodes 130 including the upper gate electrode 130U positioned between the separating structures 146. The upper separation pattern 148 may separate, e.g., three gate electrodes 130 from each other in the crossing direction (X-axis direction in the drawing). However, a number of gate electrodes 130 separated by the upper separating pattern 148 is not limited thereto, and may be variously changed. The upper separating pattern 148 may have a form filled with an insulating material. For example, the upper separating pattern 148 may include an insulating material such as a silicon oxide, a silicon nitride, or a silicon oxynitride. However, the example embodiment is not limited thereto, and the structure, shape, and material of the upper separating pattern 148 may be variously changed.

The contact region 104 and the second wire portion 180 may be provided to connect the gate stack structure 120 and the channel structure CH provided in the cell array region 102 to the circuit region 200 or an external circuit.

Herein, the second wire portion 180 may include all members electrically connecting the, gate electrode 130, the channel structure CH, the horizontal conductive layers 112 and 114, and/or the second substrate 110 to the circuit region 200 or an external circuit. For example, the second wire portion 180 may include a bit line 182, a plurality of gate contact portions 184, a source contact portion 186, a through plug 188, and contact vias 180*a* respectively connected to them, and a connecting wire 190 connecting them.

The bit line 182 may be positioned on the cell insulating layer 132 of the gate stack structure 120 disposed in the cell array region 102. The bit line 182 may extend in the cross direction (X-axis direction in the drawing) crossing one direction in which the gate electrode 130 extends. The bit line 182 may be electrically connected to the channel structure CH, e.g., the channel pad 144, through the contact via 180*a*, e.g., a bit line contact via.

The gate stack structures 120 may extend into the contact region 104. Extended lengths of the gate stack structures 120 may be substantially the same. For example, lengths of the gate electrode 130 and the interlayer insulating layer 132*m* extending in one direction (Y-axis direction in the drawing) may be substantially the same. That is, edges of the gate electrodes 130 and the interlayer insulating layer 132*m* may be aligned on a same boundary. Accordingly, side surfaces of the gate stack structures 120 may be aligned in a vertical direction (Z-axis direction in the drawing) perpendicular to the second substrate 110.

In the contact region 104, the gate contact portions 184 may extend through the gate stack structures 120 in different depths to be connected to the gate electrodes 130, respectively.

For example, one gate contact portion 184 of the plurality of gate contact portions 184 may extend through the second upper insulating layer 132*b* to be electrically connected to the gate electrode 130 positioned at an uppermost portion. Among the plurality of gate contact portions 184, remaining gate contact portions 184 may extend through a through gate electrode (reference numeral 130R in FIG. 4, hereinafter the same), which is at least a part of the gate electrodes 130 to be electrically connected to a connection gate electrode (reference numeral 130C in FIG. 4, hereinafter the same) positioned below the through gate electrode 130R.

That is, the gate contact portions 184 may extend through the gate stack structures 120 in different depths to fill contact holes CT whose lower surfaces are defined by upper surfaces of the gate electrodes 130. Lower surfaces of the gate contact portions 184 may contact portions of upper surfaces of connection gate electrodes 130C. A structure in which the gate contact portions 184 are connected to different connection gate electrodes 130C will be described later with reference to FIG. 3 and FIG. 4.

Herein, based on one gate contact portion 184, among the gate electrodes 130, the gate electrode 130 through which the gate contact portions 184 extend is referred to as the through gate electrode 130R, and the gate electrode 130 connected to the gate contact portions 184 will be referred to as the connection gate electrode 130C.

The gate contact portions 184 may have a column shape in a cross-sectional view. For example, although the gate contact portions 184 are illustrated as having a constant width according to an aspect ratio thereof in a cross-sectional view, the present disclosure is not limited thereto. For example, in a cross-sectional view, the gate contact portions 184 may have an inclined side surface such that its width narrows as it approaches the second substrate 110 according to an aspect ratio thereof.

In an example embodiment, each of the gate contact portions 184 is electrically connected to the connection gate electrode 130C, and the through gate electrode 130R positioned above the connection gate electrode 130C and the remaining gate electrodes 130 positioned below the connection gate electrode 130C may be electrically insulated from the plurality of gate contact portions 184. The through gate electrode 130R may be penetrated by the gate contact portions 184 and insulated from the gate contact portions 184 by a gate spacer 185. The through gate electrode 130R may contact the gate spacer 185.

The remaining gate electrode 130 positioned below the connection gate electrode 130C may not be penetrated by the gate contact portions 184. Accordingly, since the remaining gate electrodes 130 positioned below the connection gate electrode 130C are spaced apart from the gate contact portions 184, they may be insulated from each other.

The gate spacer 185 may surround the gate contact portions 184 (e.g., side surfaces of the gate contact portions 184). For example, the gate contact portions 184 may have a columnar shape (e.g., a cylindrical shape or a polygonal columnar shape), and the gate spacer 185 may have a planar shape such as an annular shape. The gate spacer 185 may overlap the gate contact portions 184 at an outer portion of the contact hole CT. The gate spacer 185 may be positioned on a sidewall of the contact hole CT. However, the example embodiment is not limited thereto, and the gate spacer 185 may have a ring shape, and may surround side surfaces of some of the gate contact portions 184.

The gate spacer 185 may be positioned such that the gate contact portions 184 are electrically connected to the connection gate electrode 130C and insulated from the through gate electrode 130R. For example, the gate spacer 185 may not be positioned on lower surfaces of the gate contact portions 184. That is, the gate spacer 185 may not be positioned between the gate contact portions 184 and the connection gate electrode.

The gate spacer 185 may contact the connection gate electrode 130C. For example, a lower surface of the gate spacer 185 may contact an upper surface of the connection gate electrode 130C. Accordingly, the lower surface of the gate spacer 185 may be aligned with lower surfaces of the gate contact portions 184 at a same boundary. That is, the lower surface of the gate spacer 185 and the lower surfaces of the gate contact portions 184 may be positioned at substantially a same level. Accordingly, the gate spacer 185 may surround entire side surfaces of the gate contact portions 184, and may effectively insulate between the gate contact portions 184 and the gate electrode 130 adjacent thereto.

The gate spacer 185 may include various insulating materials. For example, the gate spacer 185 may include a silicon oxide, a silicon nitride, a silicon oxynitride, a low dielectric constant material having lower permittivity than that of the silicon oxide, or a combination thereof.

Although the gate spacer 185 is illustrated as a single layer in FIG. 1, the example embodiment is not limited thereto, and a layer inevitably formed between the gate spacer 185 and the gate contact portions 184 may exist or a separate layer may be further provided.

In the contact region 104, the source contact portion 186 may extend through the cell insulating layer 132 to be electrically connected to the horizontal conductive layers 112 and 114 and/or the second substrate 110, and a through plug 188 may be positioned outside the gate stack structure 120 to be electrically connected to the first wire portion 240 of the circuit region 200. However, the present disclosure is not limited thereto, and the through plug 188 may extend through the gate stack structure 120 to be electrically connected to the first wire portion 240 of the circuit region 200.

The connecting wire 190 may be positioned in the cell array region 102 and/or the contact region 104. The bit line 182, the gate contact portions 184, the source contact portion 186, and/or the through plug 188 may be electrically connected to the connecting wire 190. For example, the gate contact portions 184, the source contact portion 186, and/or the through plug 188 may be connected to the connecting wire 190 through the contact via 180*a*.

In FIG. 1, it is illustrated that the connecting wire 190 is provided as a single layer positioned on a same plane as that of the bit line 182, and a second wire insulating layer 192 is positioned in a portion other than the second wire portion 180. However, this is only briefly illustrated for convenience. Accordingly, the connecting wire 190 may include a plurality of wiring layers for electrical connection with the bit line 182, the gate contact portions 184, the source contact portion 186, and/or the through plug 188, and may further include contact vias.

As described above, the bit line 182, the gate electrode 130, the horizontal conductive layers 112 and 114, and/or the second substrate 110 connected to the channel structure CH are electrically connected to the circuit element 220 of the circuit region 200 by the second wire portion 180 and the first wire portion 240.

In FIG. 1, in a cross-sectional view, the source contact portion 186, and/or the through plug 188 have inclined side surfaces such that widths thereof become narrower as they are closer to the second substrate 110 according to an aspect ratio, and a bent portion is provided at a boundary between the first gate stack structure 120*a* and the second gate stack structure 120*b*. However, the example embodiment is not limited thereto. For example, it is also possible that the source contact portion 186, and/or the through plug 188 do not have a bent portion at the boundary between the first gate stack structure 120*a* and the second gate stack structure 120*b*. Various other changes are possible.

Hereinafter, a semiconductor device according to an example embodiment will be described with reference to FIG. 3 and FIG. 4.

Figure 3:
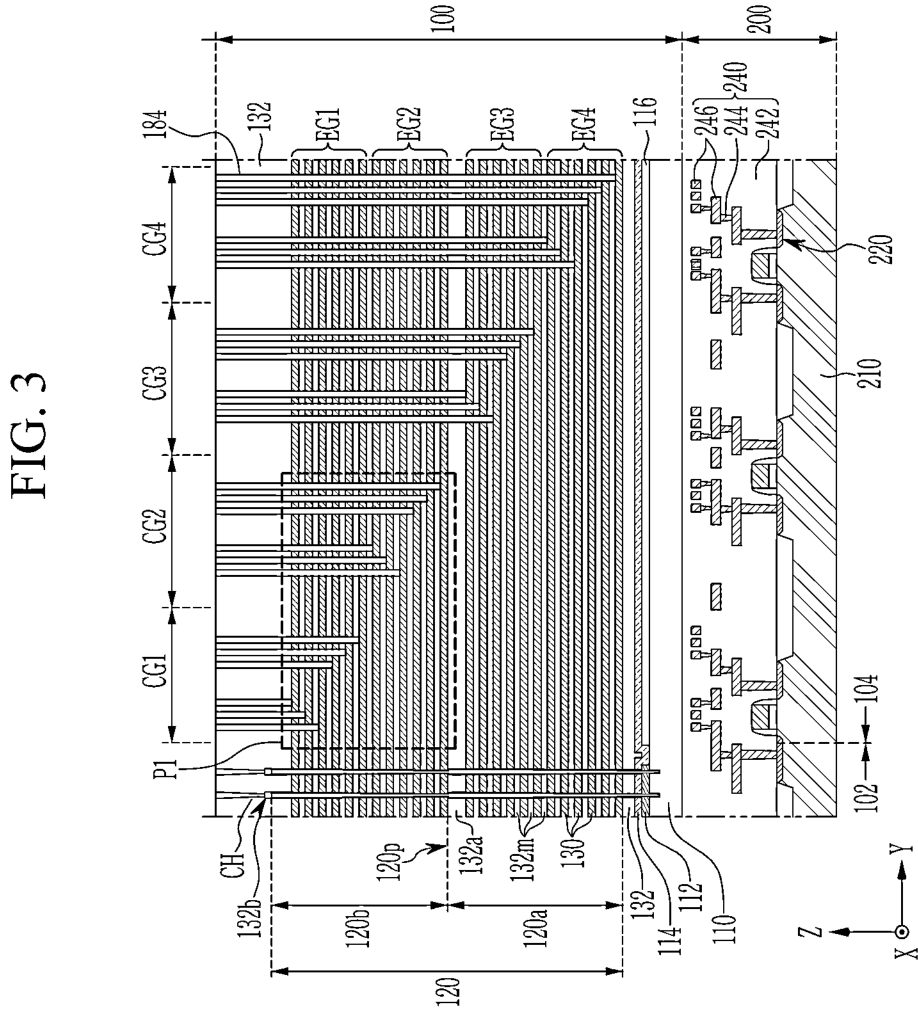
FIG. 3 illustrates a cross-sectional view showing a contact region of a semiconductor device according to an example embodiment.

FIG. 3 illustrates a cross-sectional view showing a contact region of a semiconductor device according to an example embodiment. FIG. 4 illustrates an enlarged cross-sectional view of a region P1 of FIG. 3.

For a clear understanding, in FIG. 3, a connection structure of the gate contact portions 184 and the gate electrodes 130 is mainly illustrated, and drawing of the gate spacer 185 is omitted. A detailed connection structure of the gate contact portions 184, the gate electrodes 130, and the gate spacer 185 is illustrated in FIG. 4.

Referring first to FIG. 3, the gate electrodes 130 according to an example embodiment may include a plurality of electrode groups EG. For example, the gate electrodes 130 may include first to fourth electrode groups EG1 to EG4 sequentially stacked from an upper surface of the second substrate 110. Numbers of gate electrodes 130 provided in the respective electrode groups EG may be the same.

In addition, the gate contact portions 184 according to an example embodiment may include a plurality of contact groups CG. For example, the gate contact portions 184 may include a first contact group CG1 to a fourth contact group CG4 positioned from a first side to a second side in an extending direction of the gate electrodes 130 (e.g., a second direction (Y-axis direction)). Numbers of gate contact portions 184 provided in the respective contact groups CG may be the same. FIG. 3 illustrates 4 electrode groups EG and 4 contact groups CG, but the number of electrode groups EG and the number of contact groups CG are not limited thereto.

The gate contact portions 184 provided in each of the contact groups CG1, CG2, CG3, and CG4 may be connected to the gate electrodes 130 provided in each of the respective electrode groups EG. For example, the gate contact portions 184 provided in the first contact group CG1 may be respectively connected to the gate electrodes 130 provided in the first electrode group EG1. The gate contact portions 184 provided in the second contact group CG2 may be respectively connected to the gate electrodes 130 provided in the second electrode group EG2. The gate contact portions 184 provided in the third contact group CG3 may be respectively connected to the gate electrodes 130 provided in the third electrode group EG3. The gate contact portions 184 provided in the fourth contact group CG4 may be respectively connected to the gate electrodes 130 provided in the fourth electrode group EG4.

Herein, the gate contact portions 184 connected to the gate electrodes 130 provided in the first electrode group EG1 are referred to as the first contact group CG1, the gate contact portions 184 connected to the gate electrodes 130 provided in the second electrode group EG2 are referred to as the second contact group CG2, the gate contact portions 184 connected to the gate electrodes 130 provided in the third electrode group EG3 are referred to as the third contact group CG3, and the gate contact portions 184 connected to the gate electrodes 130 provided in the fourth electrode group EG4 are referred to as the fourth contact group CG4.

The first to fourth contact groups CG1 to CG4 respectively connected to the first to fourth electrode groups EG1 to EG4 may have a same connection structure. Hereinafter, a connection structure between the first electrode group EG1 and the first contact group CG1 and a connection structure between the second electrode group EG2 and the second contact group CG2 will be described, for example.

Further referring to FIG. 4, the gate electrodes 130 may include a first electrode group 130_G1 and a second electrode group 130_G2 positioned below the first electrode group 130_G1. A number of gate electrodes 130 included in the first electrode group 130_G1 may be the same as a number of gate electrodes 130 provided in the second electrode group 130_G2. For example, as illustrated in FIG. 4, the number of gate electrodes 130 included in the first electrode group EG1 and the second electrode group EG2 may be six, but the present disclosure is not limited thereto.

In an example embodiment, the gate contact portions 184 provided in each of the first and second contact groups CG1 and CG2 may be connected to the gate electrodes 130 provided in each of the first and second electrode groups EG1 and EG2 through a same connection structure.

Specifically, as described above, the gate contact portions 184 in the first contact group CG1 may be respectively connected to the gate electrodes 130 provided in the first electrode group EG1. The gate contact portions 184 provided in the second contact group CG2 may be respectively connected to the gate electrodes 130 provided in the second electrode group EG2.

In this case, numbers of gate contact portions 184 included in the first contact group CG1 and the second contact group CG2 may be the same. For example, as illustrated in FIG. 4, each of the first contact group CG1 and the second contact group CG2 may include six gate contact portions 184. However, the present disclosure is not limited thereto, and the number of gate contact portions 184 may be a natural number that is equal to or greater than 2.

In addition, a difference in a number of layers of the connection gate electrode 130C in a direction away from the cell array region 102 in the first contact group CG1 may be the same as a difference in a number of layers of the connection gate electrode 130C in a direction away from the cell array region 102 in the second contact group CG2. For example, in the first contact group CG1, the number of layers of the connection gate electrode 130C may increase and then decrease in the direction away from the cell array region 102. In addition, in the second contact group CG2, the number of layers of the connection gate electrode 130C may increase and then decrease in the direction away from the cell array region 102. In this case, the difference in the number of layers of the connecting gate electrode 130C in the first contact group CG1 which increases and then decreases may be substantially the same as the difference in the number of layers of the connection gate electrode 130C in the second contact group CG2 which increases and then decreases.

For example, the difference in the number of layers between the connection gate electrode 130C having a greatest number of layers and the connection gate electrode 130C having a smallest number of layers in the first contact group CG1 may be equal to the difference in the number of layers between the connection gate electrode 130C having a greatest number of layers and the connection gate electrode 130C having a smallest number of layers in the second contact group CG2. In addition, as an example, a difference in a number of layers between the adjacent gate contact portions 184 and the connection gate electrode 130 in the first contact group CG1 may be the same as a difference in a number of layers of the connection gate electrode 130 connected to each of the adjacent gate contact portions 184 in the second contact group CG2.

This is due to process characteristics generated by simultaneously forming the fourth preliminary pattern (reference numeral CP4 in FIG. 9, hereinafter the same) in a first area A1 (see FIG. 5) and a second area A2 (see FIG. 5) corresponding to the first and second contact groups CG1 and CG2, respectively. A process may be simplified by forming a plurality of preliminary contact groups CPGs of the first contact group CG1 and the second contact group CG2 together.

In an example embodiment, each of the first and second electrode groups EG2 may include a lower group EGb and an upper group EGa positioned on the lower group EGb. For example, the upper group EGa of the first electrode group EG1 may be positioned on the lower group EGb of the first electrode group EG1, the lower group EGb of the second electrode group EG2 may be positioned on the upper group EGa of the first electrode group EG1, and the upper group EGa of the second electrode group EG2 may be positioned on the lower group EGb of the second electrode group EG2.

Numbers of gate electrodes 130 included in the lower group EGb and the upper group EGa may be the same. For example, as illustrated in FIG. 4, a number of gate electrodes 130 included in each of the lower group EGb and upper group EGa of the first electrode group EG1 and the lower group EGb and upper group EGa of the second electrode group EG2 may be three. However, the present disclosure is not limited thereto, and a number of gate electrodes 130 included in each of the lower group EGb and the upper group EGa may be two. Alternatively, the number of gate electrodes 130 included in each of the lower group EGb and the upper group EGa may be four or more.

Hereinafter, for convenience of description, the number of gate electrodes 130 included in each of the lower group EGb and the upper group EGa will be referred to as a unit number. For example, FIG. 4 may illustrate a case in which the unit number is 3.

In an example embodiment, each of the first and second contact groups CG1 and CG2 may include a first group CGa connected to the upper group EGa and a second group CGb connected to the lower group EGb. For example, a first group CGa of the first contact group CG1 connected to the upper group EGa of the first electrode group EG1, a second group CGb of the first contact group CG1 connected to the lower group EGb of the first electrode group EG1, a first group CGa of the second contact group CG2 connected to the upper group EGa of the second electrode group EG2, and a second group CGb of the second contact group CG2 connected to the lower group EGb of the second electrode group EG2 may be included. In addition, the first group CGa may be positioned at a first side of the gate electrodes 130 in an extending direction, and the second group CGb may be positioned at a second side of the gate electrodes 130 in an extension direction. That is, the first group CGa of first contact group CG1, the second group CGb of first contact group CG1, the first group CGa of the second contact group CG2, and the second group CGb of the second contact group CG2 may be sequentially positioned from a first side to a second side in the extending direction of the gate electrodes 130.

The gate contact portions 184 provided in the first group CGa and the second group CGb may be connected to the gate electrodes 130 provided in the upper group EGa and the lower group EGb, respectively. In this case, the number of gate contact portions 184 provided in the first group CGa and the second group CGb may correspond to the number of gate electrodes 130 included in each of the lower group EGb and the upper group EGa. That is, each of the first group CGa and the second group CGb may include gate contact portions 184 corresponding to a unit number. For example, as illustrated in FIG. 4, when the unit number is 3, each of the first group CGa and the second group CGb may include three gate contact portions 184.

In an example embodiment, a connection structure between the upper group EGa and the first group CGa and a connection structure between the lower group EGb and the second group CGb may have symmetrical structures.

Specifically, numbers of gate contact portions 184 provided in the first group CGa and the second group CGb may be the same. In addition, as described above, numbers of gate electrodes 130 provided in the upper group EGa and the lower group EGb may be the same. For example, as illustrated in FIG. 4, when the unit number is 3, each of the first group CGa and the second group CGb may include three gate contact portions 184.

In addition, differences in the numbers of layers of the connection gate electrodes 130 connected to the gate contact portions 184 may be the same in the first group CGa and the second group CGb. For example, a difference in a number of layers between the connection gate electrode 130C having a greatest number of layers and the connection gate electrode 130C having a smallest number of layers in the first group CGa may be equal to a difference in a number of layers between the connection gate electrode 130C having a greatest number of layers and the connection gate electrode 130C having a smallest number of layers in the second group CGb. In addition, as an example, a difference in a number of layers of the connection gate electrode 130 connected to the adjacent gate contact portions 184 in the first group Cga may be the same as a difference in a number of layers of the connection gate electrodes 130 connected to each of the adjacent gate contact portions 184 in the other group CGb.

In the first group CGa and the second group Cgb, a number of layers of the connection gate electrode 130 to which the gate contact portions 184 are connected may sequentially increase as a distance from a boundary between the first group CGa and the second group CGb increases. In other words, the gate contact portions 184 provided in the first group CGa may be connected to the connection gate electrode 130 positioned at a relatively lower portion as the distance from the boundary between the first group CGa and the second group CGb increases.

In the first group CGa and the second group Cgb, a number of through gate electrodes 130 through which the gate contact portions 184 extend may sequentially increase as the distance from the boundary between the first group CGa and the second group CGb increases.

Figure 4:
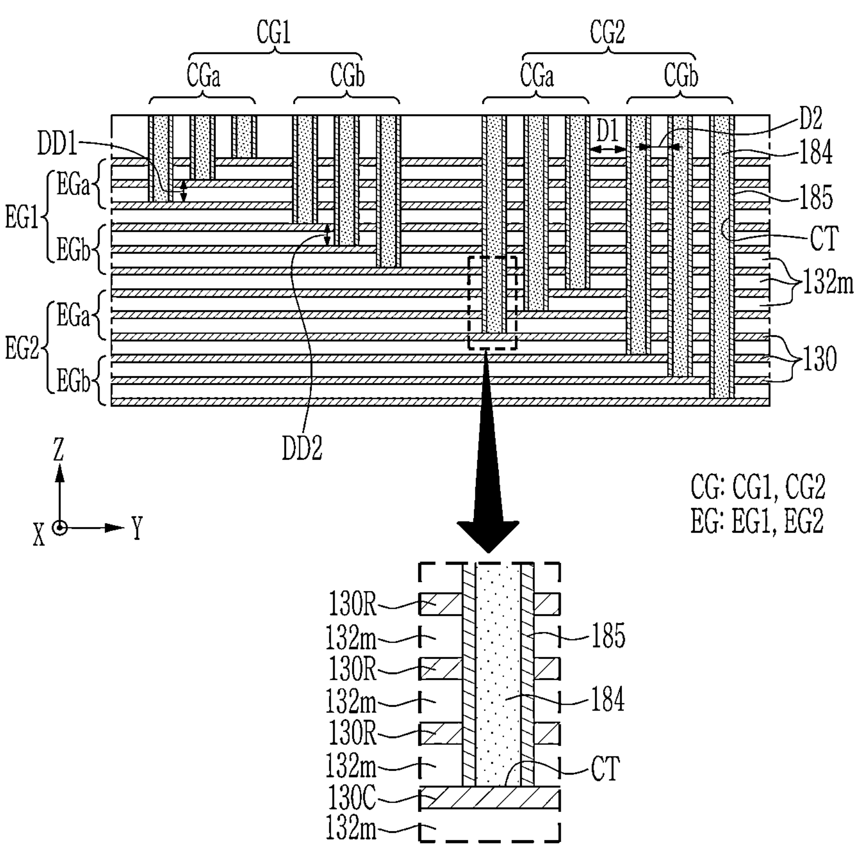
FIG. 4 illustrates an enlarged cross-sectional view of a region P1 of FIG. 3.

For example, as illustrated in FIG. 4, in the first group CGa and the second group Cgb, a number of layers of the connection gate electrode 130 to which adjacent gate contact portions 184 are connected may decrease by one layer as the distance from the boundary between the first group CGa and the second group CGb increases. However, the present disclosure is not limited thereto, and the number of layers of the connection gate electrode 130 to which adjacent gate contact portions 184 are connected may decrease by two or more layers as the distance from the boundary between the first group CGa and the second group CGb increases.

As described above, the gate contact portions 184 provided in the first group CGa and the second group CGb may extend through the through gate electrode 130 to be connected to the connection gate electrode 130 positioned below the through gate electrode 130. Accordingly, in the first group CGa and the second group Cgb, a number of through gate electrodes 130R through which each of the gate contact portions 184 extends may sequentially increase as the distance from the boundary between the first group CGa and the second group CGb increases. In this case, lengths of the gate contact portions 184 provided in the first group CGa and the second group CGb may sequentially increase as the distance from the boundary between the first group CGa and the second group CGb increases. In this case, a first distance DD1 between bottom surfaces of adjacent gate contact portions 184 in the first group CGa along the third direction (Z-axis direction) may be substantially equal to a second distance DD2 between bottom surfaces of adjacent gate contact portions 184 in the second group CGb.

However, the present disclosure is not limited thereto, and in the first group CGa and the second group Cgb, a number of layers of the connection gate electrode 130 to which the gate contact portions 184 are connected may sequentially increase as a distance from a boundary between the first group CGa and the second group CGb increases. In this case, the number of layers of the connection gate electrodes 130C to which the gate contact portions 184 are connected in the second group CGb may be greater than the number of layers of the connection gate electrodes 130C to which the gate contact portions 184 are connected in the first group CGa.

In an example embodiment, In each of the first and second contact groups CG1 and CG2, the number of layers of the connection gate electrodes 130C to which the gate contact portions 184 are connected in the second group Cgb may be smaller than the number of layers of the connection gate electrodes 130C to which the gate contact portions 184 are connected in the first group CGa. Specifically, the number of layers of any one of the connection gate electrodes 130C to which the gate contact portions 184 are connected in the second group CGb may be smaller than the number of layers of each of the connection gate electrodes 130C to which the gate contact portions 184 are connected in the first group CGa. For example, the number of layers of the connection gate electrode 130C having a greatest number of layers in the second group CGb may be smaller than the number of layers of the connection gate electrode 130C having a smallest number of layers in the first group CGa.

In addition, the number of layers of the connection gate electrode 130C to which the gate contact portion 184 is connected in the first group CGa of the second contact group CG2 may be smaller than the number of layers of the connection gate electrode 130C to which the gate contact portion 184 is connected in the second group CGb of the first contact group CG1. Specifically, the number of layers of any one of the connection gate electrodes 130C to which the gate contact portion 184 is connected in the first group CGa of the second contact group CG2 may be smaller than the number of layers of each connection gate electrode 130C to which the gate contact portion 184 is connected in the second group CGb of the first contact group CG1. For example, the number of layers of the connection gate electrode 130C having a greatest number of layers in the first group CGa of the second contact group CG2 may be smaller than the number of layers of the connection gate electrode 130C having a smallest number of layers in the second group CGb of the first contact group CG1. In this case, a length of the gate contact portion 184 provided in the first group CGa of the second contact group CG2 may be greater than a length of the gate contact portion 184 provided in the second group CGb of the first contact group CG1.

In an example embodiment, a minimum distance between the gate contact portion 184 provided in the second group CGb and the gate contact portion 184 provided in the first group CGa may be greater than a minimum distance between adjacent gate contact portions 184. For example, a first distance D1 between the gate contact portion 184 positioned on the first group CGa and the gate contact portion 184 positioned on the second group CGb adjacent to each other may be greater than a second distance D2 between adjacent gate contact portions 184 provided in the first group CGa or the second group CGb. However, the present disclosure is not limited thereto, and a first distance D1 between the gate contact portion 184 positioned in the first group CGa and the gate contact portion 184 positioned in the second group CGb adjacent to each other may be substantially equal to a second distance D2 between adjacent gate contact portions 184 provided in the first group CGa or the second group CGb.

A connection structure between the third electrode group EG3 and the third contact group CG3 and a connection structure between the fourth electrode group EG4 and the fourth contact group CG4 of the semiconductor device according to an exemplary example embodiment are substantially the same as the connection structure of the first electrode group EG1 and the first contact group CG1 and the connection structure of the second electrode group EG2 and the second contact group CG2, respectively, and thus a description thereof will be omitted.

The gate contact portions 184 of the semiconductor device according to an example embodiment may be respectively connected to the gate electrodes 130 by extending through the gate stack structure 120 in different depths. In this case, a process of forming the gate contact portions 184 may be simplified by forming a contact hole CT extending through at least a portion of the gate stack structure 120 without a process of exposing each of the gate electrodes 130.

In addition, the semiconductor device according to an example embodiment may form a plurality of preliminary contact groups CPG together by using one mask pattern in a first zone PP1 (see FIG. 5) and a second zone PP2 (see FIG. 5) corresponding to the first group CGa and the second group CGb, respectively. Accordingly, a connection structure between the upper group EGa and the first group CGa and a connection structure between the lower group EGb and the second group CGb may have symmetrical structures. Thereafter, contact holes CT having different depths may be formed through an additional etching process sequentially for each region. Accordingly, the etching process of forming the contact holes CT may be easily controlled and simplified.

In addition, the gate contact portions 184 provided in each of the first and second contact groups CG1 and CG2 may be connected to the gate electrodes 130 provided in each of the first and second electrode groups EG1 and EG2 through a same connection structure. Accordingly, reliability and productivity of the semiconductor device 10 may be improved.

Hereinafter, a method of manufacturing a semiconductor device according to an example embodiment will be described with reference to FIG. 5 to FIG. 14.

FIG. 5 to FIG. 14 illustrate process cross-sectional views sequentially showing a manufacturing method for semiconductor device according to an example embodiment of the present disclosure. FIG. 5 to FIG. 14 each illustrate a portion of the contact region 104 for convenience, and the cell array region is omitted. Hereinafter, a method of manufacturing a contact region of a semiconductor device according to an example embodiment will be mainly described.

Figure 5:
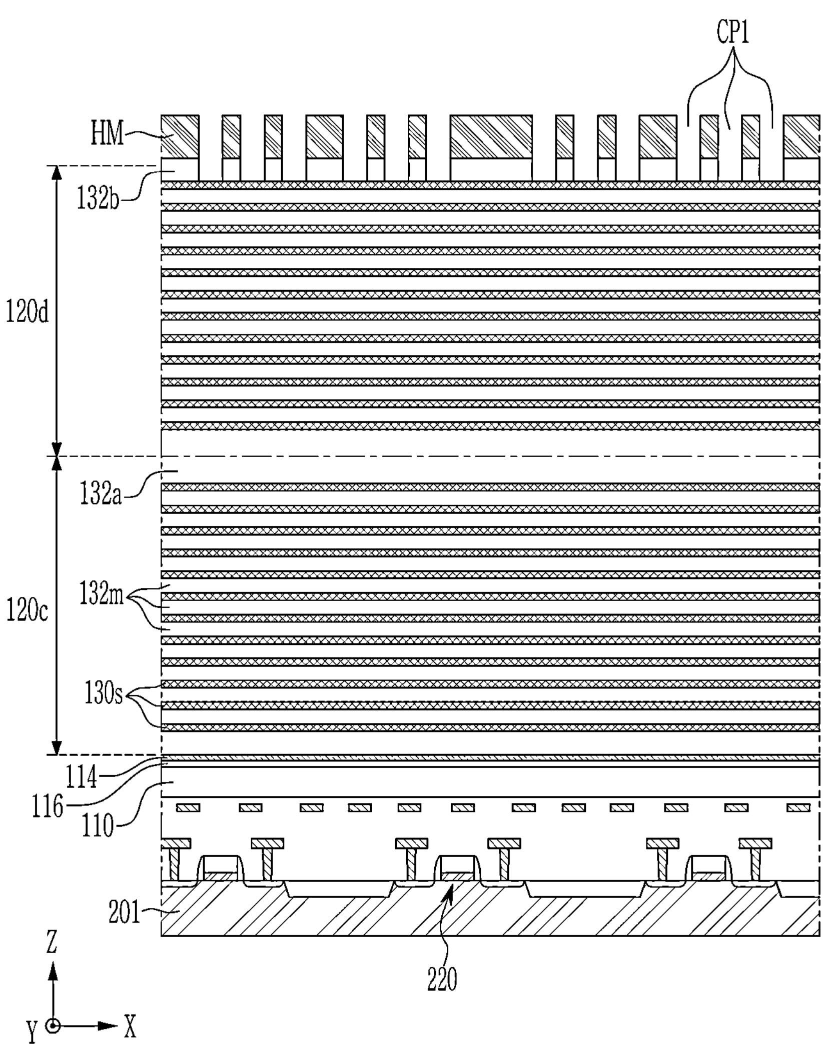
FIG. 5 to FIG. 14 illustrate process cross-sectional views sequentially showing a manufacturing method for semiconductor device according to an example embodiment of the present disclosure.

Referring to FIG. 5, stack structures 120*c* and 120*d* are positioned on the circuit region 200 including a peripheral circuit structure.

First, the first stack structure 210*c* as a lower structure may be formed by alternately stacking a sacrificial insulating layer 130*s* and the interlayer insulating layer 132*m*. The first upper insulating layer 132*a* may be positioned at an uppermost portion of the first stack structure 120*c*. The second substrate 110, the horizontal insulating layer 116, the second horizontal conductive layer 114, and the like may be further formed between the circuit region 200 and the first stack structure 120*c*.

The horizontal insulating layer 116 and/or the sacrificial insulating layer 130*s* may be formed of a different material from that of the interlayer insulation layer 132*m*. For example, the interlayer insulating layer 132*m* may include a silicon oxide, a silicon nitride, a silicon oxynitride, a low dielectric constant material, etc., and the sacrificial insulating layer 130*s* may include one of silicon, silicon oxide, silicon carbide, silicon nitride, etc., and may be made of a different material from that of the interlayer insulating layer 132*m*.

Then, the sacrificial insulating layer 130*s* and the interlayer insulating layer 132*m* may be alternately stacked on the first stack structure 120*c* to form a second stack structure 120*d* as an upper structure. The second upper insulating layer 132*b* may be positioned at an uppermost portion of the second stack structure 120*d*. A method of manufacturing the sacrificial insulating layer 130*s*, the interlayer insulating layer 132*m*, and the second upper insulating layer 132*b* of the second stack structure 120*d* may be the same as that of the first stack structure 120*c*, and a description thereof is omitted.

Although the drawings show that the stack structures 120*c* and 120*d* are formed of two stack structures, the present disclosure is not limited thereto, and the stack structures 120*c* and 120*d* may be made of one stack structure, and may be formed to include three or more stack structures.

The sacrificial insulating layer 130*s* may be a layer replaced with a gate electrode 130 (see FIG. 1) in a subsequent process. That is, the sacrificial insulating layer 130*s* may be formed to correspond to a portion where the gate electrode 130 (see FIG. 1) is to be formed.

Subsequently, a hard mask HM may be positioned on the second stack structure 120*d*, and first preliminary patterns CP1 extending through the hard mask HM and the second upper insulating layer 132*b* may be formed. Since the hard mask HM serves as a mask pattern in a repeated etching process in a subsequent process, it may be formed to a sufficient thickness considering the thickness damaged in the repeated etching process.

The first preliminary patterns CP1 may have a vertical etch structure formed by etching the hard mask HM and the second upper insulating layer 132*b* in a vertical direction. Accordingly, an entire side surface of the first preliminary patterns CP1 may be configured as a vertical surface perpendicular to the second substrate 110. However, the present disclosure is not limited thereto, and the entire side surface of the first preliminary patterns CP1 may be configured as an inclined surface whose width gradually decreases toward the second substrate 110.

The first preliminary patterns CP1 may be formed using an etching process using the sacrificial insulating layer 130*s* positioned at an uppermost portion as an etch stop layer. Accordingly, an upper surface of the sacrificial insulating layer 130*s* may be exposed. Herein, the first preliminary patterns CP1 are for forming the gate contact portions 184, and may be positioned in the contact region 104.

A same number of first preliminary patterns CP1 may be formed in each of the areas A1 and A2. For example, six first preliminary patterns CP1 may be formed in each of the first area A1 and the second area A2. In addition, a same number of first preliminary patterns CP1 may be formed in each of the zones PP1 and PP2. For example, three first preliminary patterns CP1 may be formed in each of the first zone PP1 and the second zone PP2. Herein, the first area A1 and the second area A2 may be areas where the first contact group CG1 and the second contact group CG2 are formed, respectively. In addition, the first zone PP1 and the second zone PP2 may be areas where the first group CGa and the second group CGb are formed, respectively.

Hereinafter, a process of forming the preliminary contact groups CPG using a first mask pattern M1 will be described with reference to FIG. 6 to FIG. 9. Herein, the preliminary contact groups CPG include the first group CGa and the second group CGb, and may be positioned on a same upper gate electrode group. For example, each of the preliminary contact groups CPG may be connected to a same number of sacrificial insulating layers 130*s*, and connection structures with the sacrificial insulating layers 130*s* in the first group CGa and the second group CGb may be identical to each other.

Figure 6:
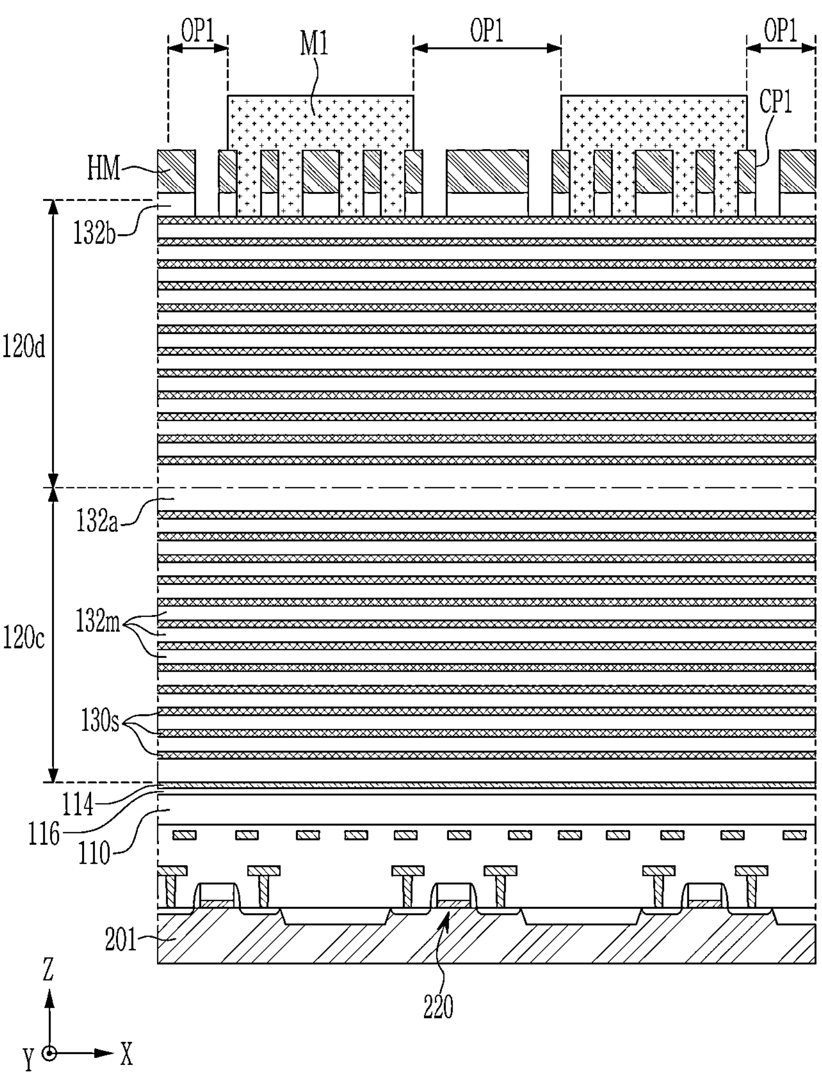

Referring to FIG. 6, the first mask pattern M1 including a first open portion OP1 is positioned on the hard mask HM. The first mask pattern M1 may be a photoresist pattern. The first mask pattern M1 may be positioned in each of the areas A1 and A2. For example, the first mask pattern M1 may be positioned in each of the first area A1 and the second area A2. The first open portion OP1 may be formed between the areas A1 and A2. The first open portion OP1 may be formed to expose the first preliminary patterns CP1 to each of the areas PP1 and PP2.

As the first open portion OP1 is formed, a same number of first preliminary patterns CP1 may be exposed in each of the areas PP1 and PP2. For example, one first preliminary pattern CP1 may be exposed in each of the first zone PP1 of the first area A1, the second zone PP2 of the first area A1, the first zone PP1 of the second area A2, and the second zone of the second area A2. In this case, the exposed first preliminary patterns CP1 may be symmetrically positioned based on the boundary between the first zone PP1 and the second zone PP2. In addition, a shape and disposition of the exposed first preliminary patterns CP1 may be substantially the same in the first area A1 and the second area A2.

Figure 7:
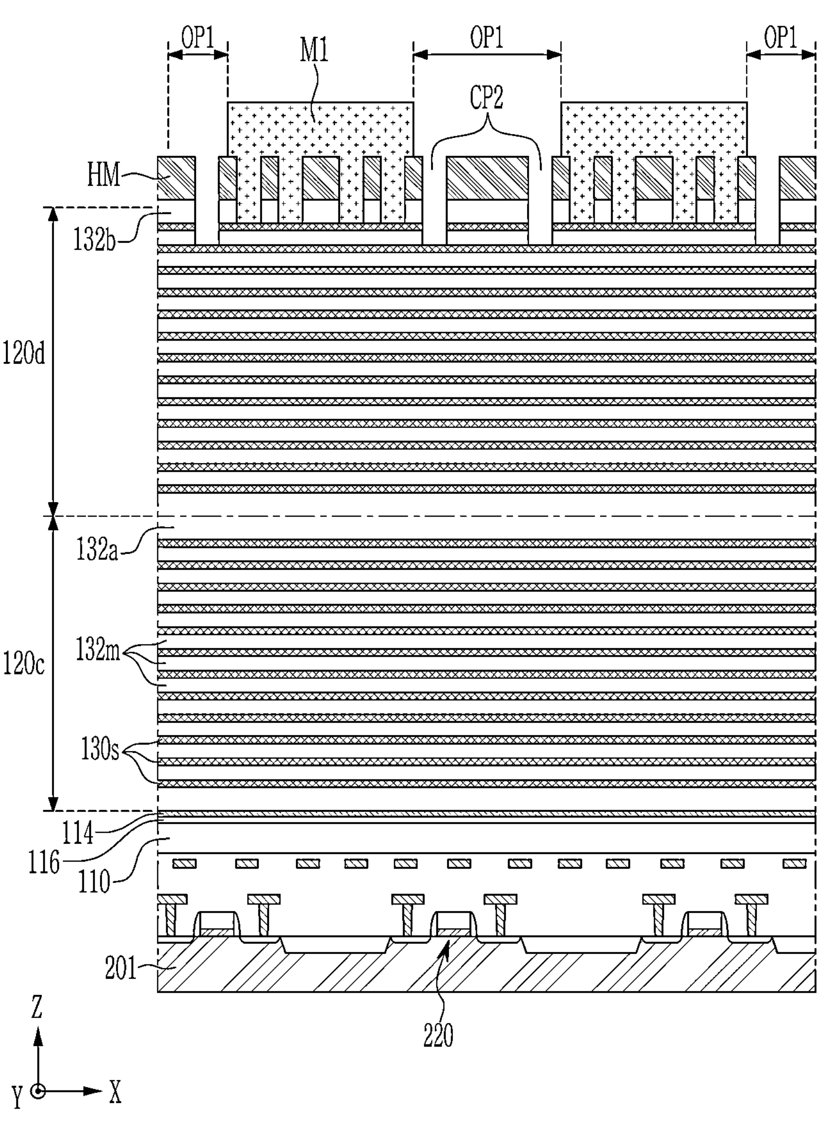

Referring to FIG. 7, the first preliminary patterns CP1 exposed in the respective zones PP1 and PP2 are etched using the first mask pattern M1 as a mask to form second preliminary patterns CP2. For example, the second preliminary patterns CP2 may be formed by partially etching a single sacrificial insulating layer 130*s* and a single interlayer insulating layer 132*m* within the exposed first preliminary patterns CP1. As the second preliminary patterns CP2 are formed, the sacrificial insulating layer 130*s* may be exposed. A process of forming the second preliminary patterns CP2 may be formed by various etching processes. For example, the second preliminary patterns CP2 may be formed by a plasma etching process and have vertical or inclined surfaces, but the present disclosure is not limited thereto. The second preliminary patterns CP2 may be formed by extending the first preliminary patterns CP1 downward.

The second preliminary patterns CP2 may be positioned at opposite sides of the first mask pattern M1 in the first area A1 and the second area A2, respectively. The second preliminary patterns CP2 may have a same structure in the first area A1 and the second area A2. In addition, the second preliminary patterns CP2 may be symmetrically positioned based on the boundary between the first zone PP1 and the second zone PP2.

Bottom surfaces of the second preliminary patterns CP2 may be positioned at a lower level than those of the bottom surfaces of the first preliminary patterns CP1. For example, the distance between the bottom surfaces of the second preliminary patterns CP2 and the bottom surfaces of the first preliminary patterns CP1 may be substantially the same as a distance between adjacent sacrificial insulating layers 130*s*.

In this case, a portion of the first mask pattern M1 may be etched together. However, even if a part of the first mask pattern M1 is etched by a repeated etching process, the first preliminary patterns CP1 may not be exposed because the first mask pattern M1 is formed to a sufficient thickness.

Figure 8:
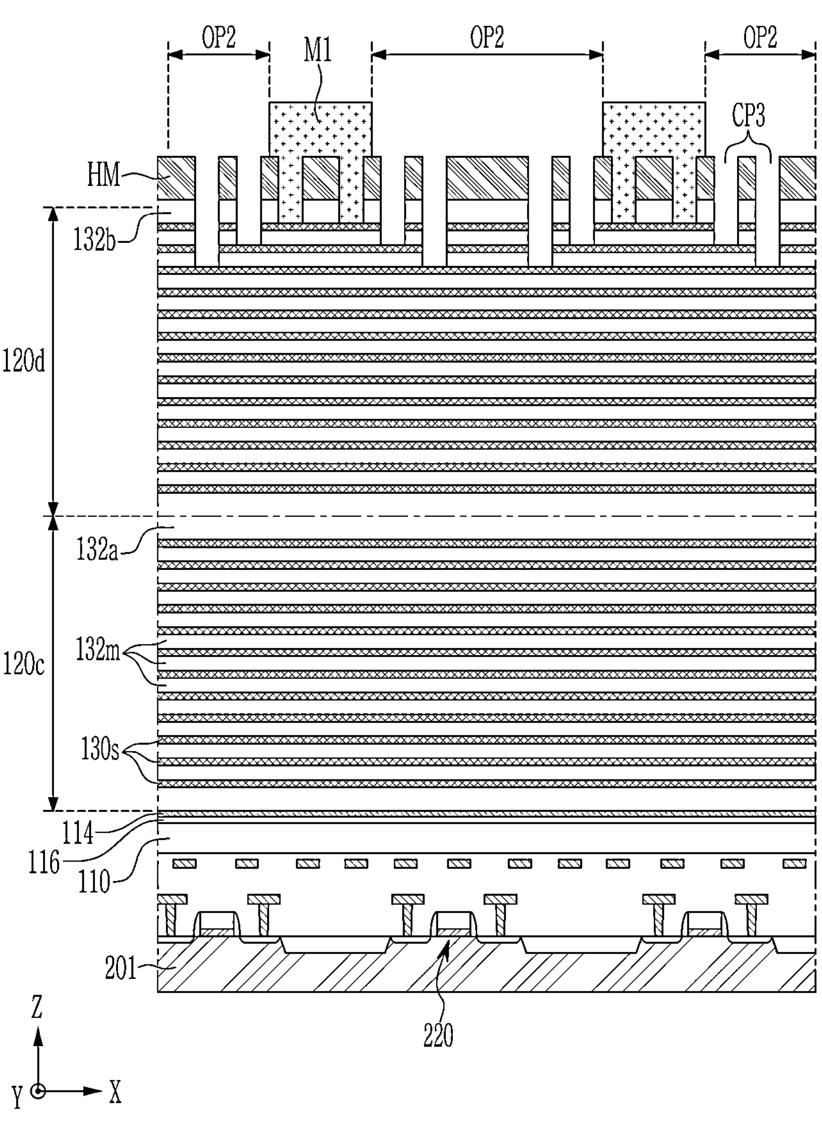

Referring to FIG. 8, first, a second open portion OP2 is formed by extending the first open portion OP1. For example, the first open portion OP1 may be enlarged by etching opposite sides of the first mask pattern M1 in a vertical direction. Accordingly, the first preliminary patterns CP1 may be additionally exposed in each of the zones PP1 and PP2 through the expanded second open portion OP2. A same number of first preliminary patterns CP1 may be additionally exposed in each of the zones PP1 and PP2. For example, one first preliminary pattern CP1 may be additionally exposed in each of the first zone PP1 of the first area A1, the second zone PP2 of the first area A1, the first zone PP1 of the second area A2, and the second zone of the second area A2.

The additionally exposed first preliminary patterns CP1 may be positioned adjacent to each of the second preliminary patterns CP2. That is, the additionally exposed first preliminary patterns CP1 may be positioned at opposite sides of the first mask pattern M1 in the first area A1 and the second area A2, respectively. A shape and disposition of the exposed first preliminary patterns CP1 may be substantially the same in the first area A1 and the second area A2. In this case, the additionally exposed first preliminary patterns CP1 may be symmetrically positioned based on the boundary between the first zone PP1 and the second zone PP2. This is because opposite sides of the first mask pattern M1 are equally etched to form the second open portion OP2.

Figure 9:
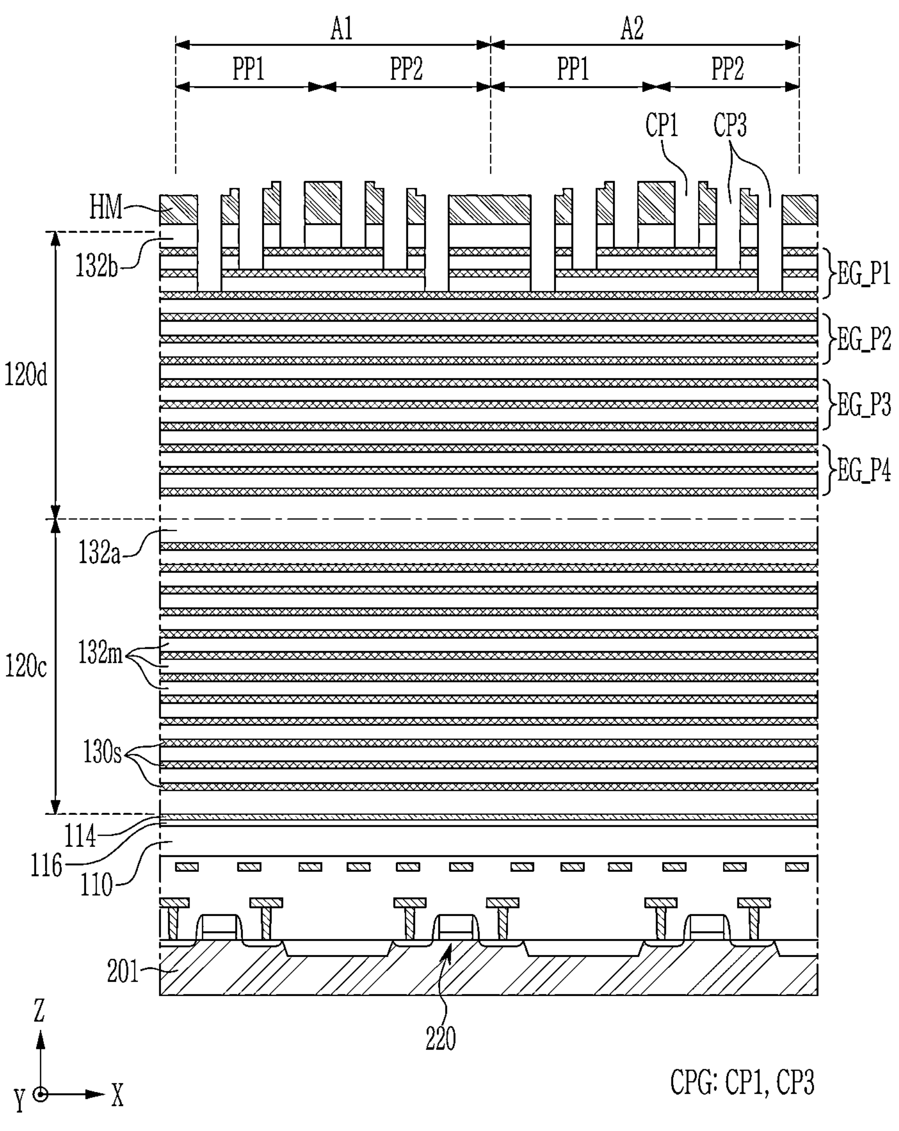

Referring to FIG. 9, a third preliminary pattern CP3 may be formed using the first mask pattern M1, and the preliminary contact groups CPG including the first zone PP1 and the second zone PP2 may be formed in an upper sacrificial insulating layer group (e.g., a first sacrificial insulating layer group EG_P1).

First, the third preliminary pattern CP3 may be formed by etching the first preliminary patterns CP1 and the second preliminary patterns CP2 exposed in each of the zones PP1 and PP2 using the first mask pattern M1 as a mask. For example, a single sacrificial insulating layer 130*s* and a single interlayer insulating layer 132*m* may be partially etched within the first preliminary patterns CP1 and the second preliminary patterns CP2 which are exposed. A process of forming the third preliminary patterns CP3 may be formed by various etching processes. For example, the third preliminary patterns CP3 may be formed by a plasma etching process and have vertical or inclined surfaces, but the present disclosure is not limited thereto.

Then, the preliminary contact groups CPG including the first zone PP1 and the second zone PP2 may be formed in an upper sacrificial insulating layer group (e.g., the first sacrificial insulating layer group EG_P1) by removing the first mask pattern M1.

The preliminary contact groups CPG may include the first zone PP1 and the second zone PP2. In addition, the preliminary contact groups CPG may include the first area A1 and the second area A2.

In an example embodiment, a plurality of preliminary contact groups CPG formed in each of the areas A1 and A2 may have a same structure. For example, the preliminary contact groups CPG formed in the first area A1 and the second area A2 may have a same shape. Specifically, the preliminary contact groups CPG provided in the first zone PP1 of the first area A1 and the preliminary contact groups CPG provided in the first zone PP1 of the second area A2 may have a same shape. In addition, the preliminary contact groups CPG provided in the second zone PP2 of the first area A1 and the preliminary contact groups CPG provided in the second zone PP2 of the second area A2 may have a same shape.

Specifically, each of the preliminary contact groups CPG formed in each of the areas A1 and A2 may expose the sacrificial insulating layer 130*s* positioned at different numbers of layers. That is, the preliminary contact groups CPG formed in each of the areas A1 and A2 may have different depths.

Meanwhile, the sacrificial insulating layer 130*s* may include a plurality of sacrificial insulating layer groups EG_P1, EG_P2, EG_P3, and EG_P4. For example, the sacrificial insulating layer 130*s* may include first to fourth sacrificial insulating layer groups EG_P1 to EG_P4 sequentially stacked. Numbers of sacrificial insulating layers 130*s* provided in the respective first to fourth sacrificial insulating layer groups EG_P1 to EG_P4 may be the same. For example, three sacrificial insulating layers 130*s* may be provided in each of the first to fourth sacrificial insulating layer groups EG_P1 to EG_P4.

In this case, the preliminary contact groups CPG formed in each of the areas A1 and A2 may expose an upper surface of the upper sacrificial insulating layer group (e.g., the first sacrificial insulating layer group EG_P1). For example, each of the preliminary contact groups CPG formed in each of the areas A1 and A2 may expose an upper surface of the sacrificial insulating layer 130*s* positioned in different number of layers provided in each of the first to fourth sacrificial insulating layer groups EG_P1 to EG_P4. Herein, the upper sacrificial insulating layer group (e.g., the first sacrificial insulating layer group EG_P1) may be the sacrificial insulating layer 130*s* exposed by the third preliminary pattern CP3.

Hereinafter, the upper sacrificial insulating layer group will be referred to as a first sacrificial insulating layer group EG_P1.

In an example embodiment, each of the first to fourth sacrificial insulation layer groups EG_P1 to EG_P4 may correspond to the upper group EGa and the lower group EGb of the first electrode group EG1 and the upper group EGa and the lower group EGb of the second electrode group EG2. Hereinafter, for convenience of description, a number of sacrificial insulating layers 130*s* included in each of the first to fourth sacrificial insulating layer groups EG_P1 to EG_P4 will be referred to as a unit number. For example, when the unit number is 3, each of the first to fourth sacrificial insulating layer groups EG_P1 to EG_P4 may include three sacrificial insulating layers 130*s*. In this case, three preliminary contact groups CPG may be formed in each of the zones PP1 and PP2.

In an example embodiment, the preliminary contact groups CPG may be symmetrically positioned based on a boundary between the first zone PP1 and the second zone PP2. Specifically, depths of the preliminary contact groups CPG may increase as a distance from the boundary between the first zone PP1 and the second zone PP2 increases. This is because it was formed by repeatedly performing a process of etching opposite sides of the first mask pattern M1 in a vertical direction to expose the first preliminary patterns CP1 and etching the exposed first preliminary patterns CP1.

Accordingly, a number of sacrificial insulating layers 130*s* included in the first sacrificial insulating layer group EG_P1 may correspond to a number of preliminary contact groups CPG formed in each of the zones PP1 and PP2. For example, three preliminary patterns may be formed in each of the zones PP1 and PP2, and the first sacrificial insulating layer group EG_P1 may include three sacrificial insulating layers 130*s*, but the present disclosure is not limited thereto. The number of sacrificial insulating layers 130*s* included in each of the first to fourth sacrificial insulating layer groups EG_P1 to EG_P4 may be the same as the number of gate electrodes 130 included in each of the lower group EGb (see FIG. 4) and the upper group EGa (see FIG. 4).

In an example embodiment, it has been described that the first mask pattern M1 is removed to form the preliminary contact groups CPG, the present disclosure is not limited thereto. For example, a process of removing the first mask pattern M1 and etching the exposed first and third preliminary patterns CP1 and CP3 may be further included. For example, a single sacrificial insulating layer 130*s* and a single interlayer insulating layer 132*m* may be partially etched within the first preliminary patterns CP1 and the third preliminary patterns CP3 which are exposed.

In an example embodiment, it is illustrated that three preliminary contact groups CPG are formed in each of the first zone PP1 and the second zone PP2 in the first area A1 and the first zone PP1 and the second zone PP2 of the second area A2, the present disclosure is not limited thereto. For example, four or more preliminary contact groups CPG may be provided in each of the first zone PP1 and the second zone PP2 in the first area A1 and the first zone PP1 and the second zone PP2 of the second area A2. In this case, steps of additionally exposing the first preliminary patterns CP1 by partially removing the first mask pattern M1 in the vertical direction and etching the exposed first preliminary patterns CP1 may be repeatedly performed several times. The first mask pattern M1 is formed at a position where the first preliminary patterns CP1 are not exposed, but as an open portion of the first mask pattern M1 expands, the first preliminary patterns CP1 are sequentially exposed. Accordingly, the first preliminary patterns CP1 may be extended in various depths. Alternatively, two preliminary patterns may be formed in each of the first zone PP1 and the second zone PP2 in the first area A1 and the first zone PP1 and the second zone PP2 of the second area A2.

Hereinafter, a process of forming a plurality of contact holes CT having different depths using a second mask pattern M2 will be described with reference to FIG. 10 to FIG. 14.

Figure 10:
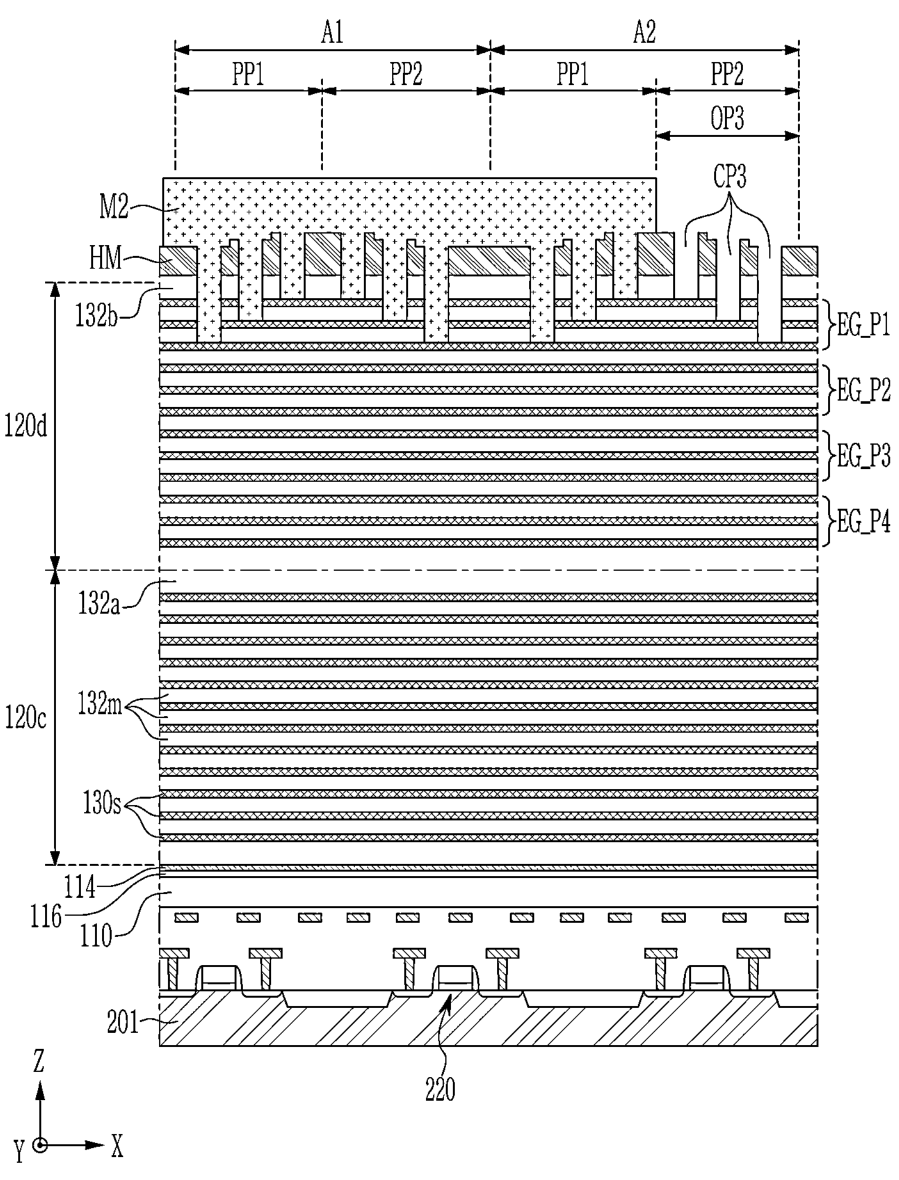

Referring to FIG. 10, the second mask pattern M2 including a third open portion OP3 is formed on the hard mask HM. The second mask pattern M2 may be a photoresist pattern. The second mask pattern M2 may extend in an extending direction of the sacrificial insulating layers 130*s*. The second mask pattern M2 may be positioned at a first side of the sacrificial insulating layers 130*s* in the extending direction.

The third open portion OP3 of the second mask pattern M2 may expose one zone unit. For example, the third open portion OP3 may expose the third preliminary patterns CP3 positioned in the second zone PP2 of the second area A2. The third open portion OP3 of the second mask pattern M2 may expose the third preliminary patterns CP3 having different depths.

Figure 11:
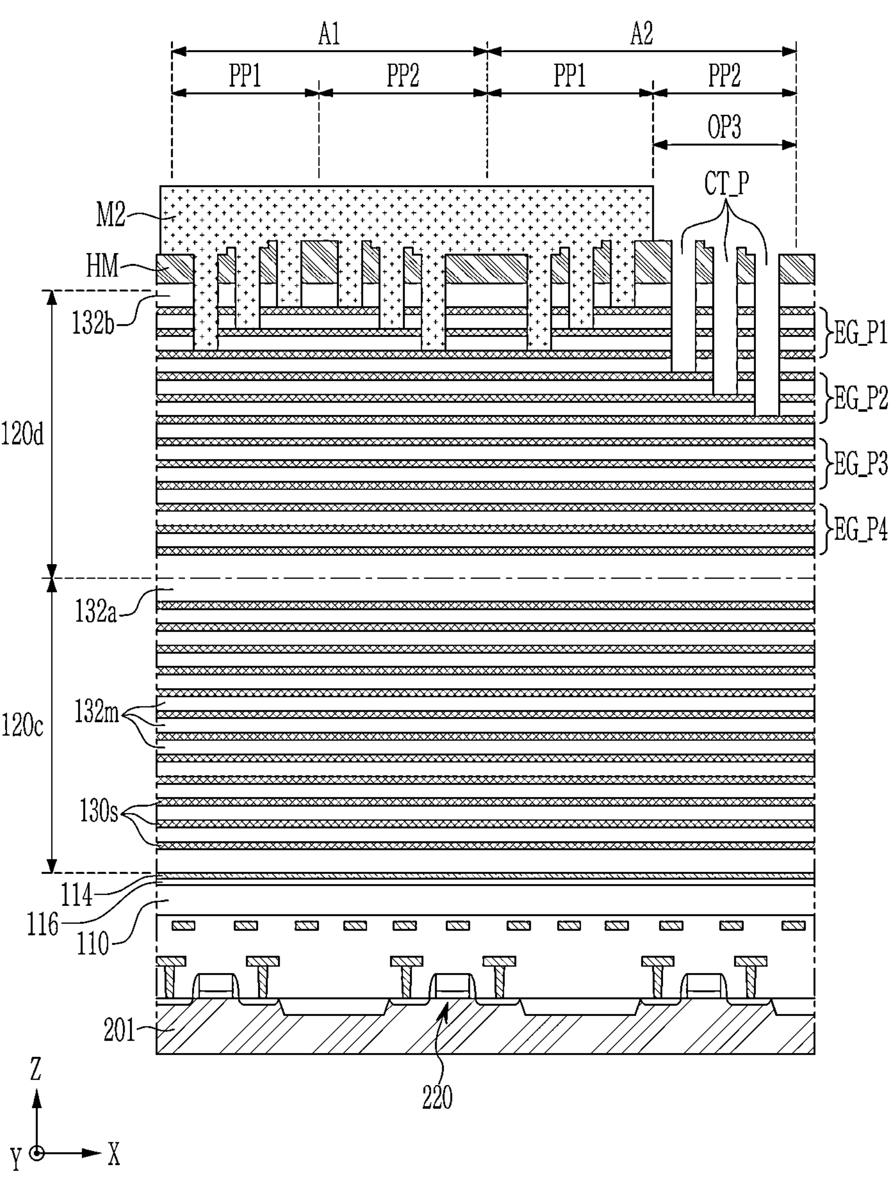

Referring to FIG. 11, preliminary contact holes CT_P may be formed by etching the exposed preliminary contact group CPG using the second mask pattern M2 as a mask.

A process of forming the preliminary contact holes CT_P in the second zone PP2 of the second area A2 may be formed by etching the sacrificial insulating layer 130*s* corresponding to the unit number. That is, the process of forming the preliminary contact holes CT_P may be formed by etching the sacrificial insulating layers 130*s* of a same number as the number of sacrificial insulating layers 130*s* included in the first sacrificial insulating layer group EG_P1. For example, as illustrated in FIG. 11, when the unit number is 3, the preliminary contact holes CT_P may be formed by partially etching a 3-layer sacrificial insulating layer 130_s_ and a 3-layer interlayer insulating layer 132_m_ in the preliminary contact group CPG of the second zone PP2 of the second zone A2. The preliminary contact holes CT_P may be formed by extending the preliminary contact group CPG to a lower portion of the sacrificial insulating layer 130_s_.

Accordingly, an upper surface of the second sacrificial insulating layer group EG_P2 may be exposed by the preliminary contact holes CT_P formed in the second zone PP2 of the second area A2. The preliminary contact holes CT_P may extend through the first sacrificial insulating layer group EG_P1. Herein, each of the first and second sacrificial insulating layer groups EG_P2 may correspond to the upper group EGa (see FIG. 4) and the lower group EGb (see FIG. 4) of the first electrode group EG1.

Meanwhile, as the preliminary contact group CPG exposed by the third open portion OP3 is etched together, a difference in the number of layers of the sacrificial insulating layer 130_s_ exposed by the preliminary contact holes CT_P may be substantially the same as a difference in the number of layers of the sacrificial insulating layer 130_s_ exposed by the preliminary contact group CPG. For example, the difference in the number of layers of the sacrificial insulation layer 130_s_ exposed by the adjacent preliminary contact holes CT_P may be equal to the difference in the number of layers of the sacrificial insulation layer 130_s_ exposed by the adjacent third preliminary patterns CP3.

A process of forming the preliminary contact holes CT_P may be formed by various etching processes. For example, the preliminary contact holes CT_P may be formed by a plasma etching process and have vertical or inclined surfaces, but the present disclosure is not limited thereto.

Figure 12:
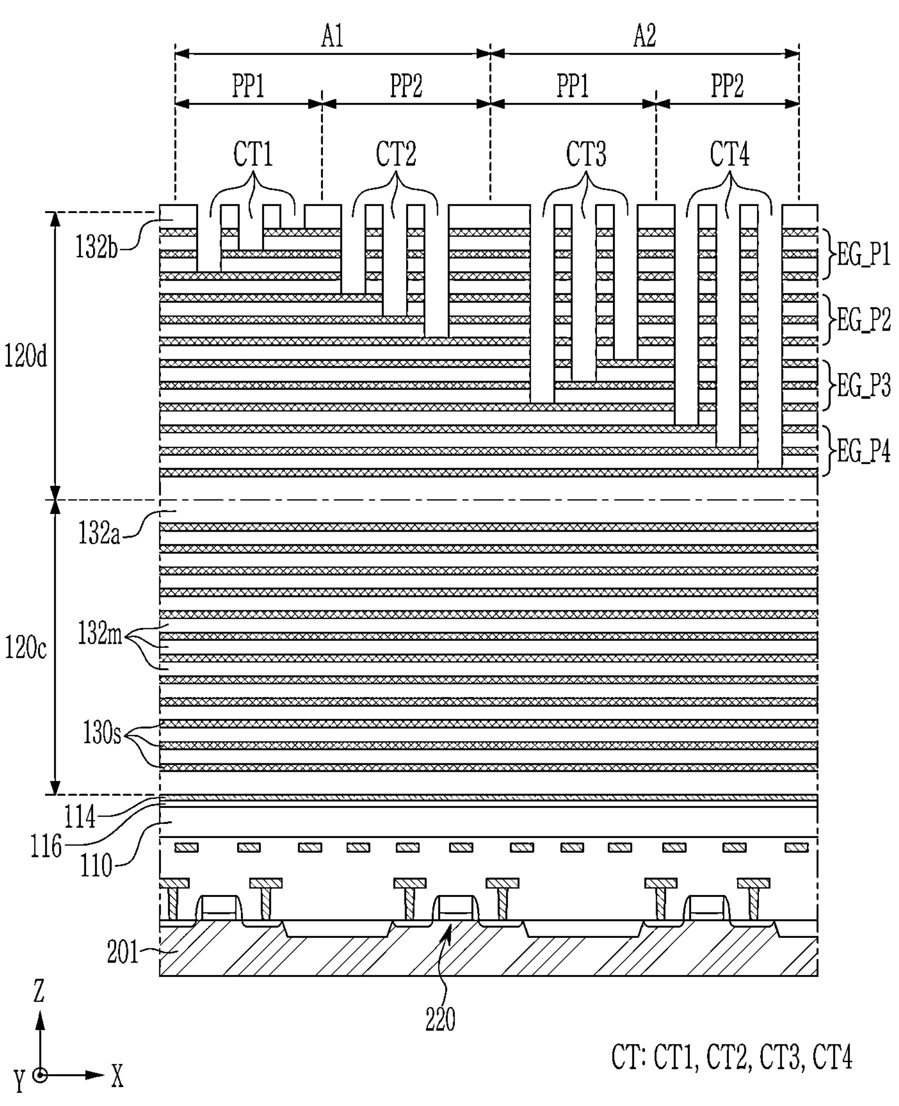

Referring to FIG. 12, a first side of the second mask pattern M2 may be etched in the vertical direction to expand the third open portion OP3. An extended open portion of the second mask pattern M2 may expose one zone unit. For example, the third open portion OP3 may be expanded to expose the first zone PP1 of the second area A2.

Accordingly, the preliminary contact group CPG may be additionally exposed through the expanded open portion. For example, the preliminary contact group CPG positioned in the first zone PP1 of the second area A2 may be additionally exposed.

Subsequently, the exposed preliminary contact group CPG may be etched using the second mask pattern M2 as a mask. A process of etching the preliminary contact group CPG exposed in the first zone PP1 of the second area A2 may be formed by etching the sacrificial insulating layer 130_s_ corresponding to the unit number. That is, the process of forming the preliminary contact holes CT_P may be formed by etching the sacrificial insulating layers 130_s_ of a same number as the number of sacrificial insulating layers 130_s_ included in the first sacrificial insulating layer group EG_P1. For example, when the unit number is 3, the preliminary contact holes CT_P may be formed by partially etching a 3-layer sacrificial insulating layer 130_s_ and a 3-layer interlayer insulating layer 132_m_ in the preliminary contact group CPG of the first zone PP1 of the second zone A2.

Accordingly, an upper surface of the second sacrificial insulating layer group EG_P2 may be exposed by the preliminary contact holes CT_P formed in the first zone PP1 of the second area A2. The preliminary contact holes CT_P formed in the first zone PP1 of the second area A2 may extend through the first sacrificial insulating layer group EG_P1.

In this case, the preliminary contact holes CT_P formed in the second zone PP2 of the second area A2 may be etched together. For example, the sacrificial insulating layer 130_s_ corresponding to the unit number may be etched in the preliminary contact holes CT_P formed in the second zone PP2 of the second area A2. For example, when the unit number is 3, a 3-layer sacrificial insulating layer 130_s_ and a 3-layer insulating interlayer 132_m_ may be etched in the preliminary contact holes CT_P formed in the second zone PP2 of the second area A2. Accordingly, an upper surface of the third sacrificial insulating layer group EG_P3 may be exposed by the preliminary contact holes CT_P formed in the second zone PP2 of the second area A2. The preliminary contact holes CT_P formed in the second zone PP2 of the second area A2 may extend through the first and second sacrificial insulating layer groups EG_P1 and EG_P2.

Subsequently, steps of etching a first side of the second mask pattern M2 in the vertical direction to additionally expose the zone unit and etching the exposed preliminary contact group CPG may be repeatedly performed several times. As the open portion of the second mask pattern M2 expands, the preliminary contact groups CPG of each of the zones PP1 and PP2 may be sequentially exposed, and the exposed preliminary contact group CPG may be etched. In this case, the preliminary contact holes CT_P formed in each of the zones PP1 and PP2 may be etched together.

Accordingly, contact holes CT having different depths may be formed. Specifically, in the first area A1, upper surfaces of the first sacrificial insulating layer group EG_P1 may each be exposed by the first contact hole CT1, and upper surfaces of the second sacrificial insulating layer group EG_P2 may each be exposed through the second contact hole CT2. In addition, in the second area A2, upper surfaces of the third sacrificial insulating layer group EG_P3 may each be exposed by the third contact hole CT3, and upper surfaces of the fourth sacrificial insulating layer group EG_P4 may each be exposed through the fourth contact hole CT4. Herein, the first contact hole CT1 may be contact holes CT formed in the first zone PP1 of the first area A1. The second contact hole CT2 may be contact holes CT formed in the second zone PP2 of the first area A1. The third contact hole CT3 may be contact holes CT formed in the first zone PP1 of the second area A2. The fourth contact hole CT4 may be contact holes CT formed in the second zone PP2 of the second area A2.

In an example embodiment, the contact holes CT may have different depths. For example, depths of the contact holes CTs provided in the first area A1 may be smaller than lengths of the contact holes CTs provided in the second area A2. For example, a number of layers of any one of the contact holes CT provided in the second area A2 may be longer than a length of each of the contact holes CT provided in the first area A1. In addition, a depth of the contact holes CT provided in the first zone PP1 may be smaller than a length of the contact holes CT provided in the second zone PP2. For example, a number of layers of any one of the contact holes CT provided in the first zone PP1 may be longer than a length of each of the contact holes CT provided in the first zone PP1.

In an example embodiment, a connection structure between the first sacrificial insulation layer group EG_P1 and the first zone PP1 and a connection structure between the second sacrificial insulation layer group EG_P2 and the first zone PP1 may have symmetrical structures to each other. In addition, a connection structure between the third sacrificial insulation layer group EG_P3 and the first zone PP1 and a connection structure between the fourth sacrificial insulation layer group EG_P4 and the first zone PP1 may have symmetrical structures to each other. For example, in the first zone PP1 and the second zone PP2, the number of layers of the sacrificial insulating layer 130*s* exposed by the contact holes CT may sequentially decrease as a distance from a boundary between the first zone PP1 and the second zone PP2 increases. In other words, the contact holes CT provided in the first zone PP1 may expose the sacrificial insulating layer 130*s* positioned relatively lower as the distance from the boundary between the first zone PP1 and the second zone PP2 increases.

In other words, the depth of the contact holes CT provided in the first zone PP1 may sequentially decrease as a distance from the cell array region 102 increases. The contact holes CT provided in the first zone PP1 may expose the sacrificial insulating layer 130*s* positioned on a relatively upper portion in a direction away from the cell array region 102. In this case, the length of the contact holes CT provided in the first zone PP1 may be sequentially decreased at predetermined intervals. The predetermined intervals may be substantially the same as a distance between adjacent sacrificial insulating layers 130*s*.

In other words, the length of the contact holes CT provided in the second zone PP2 may sequentially increases as a distance from the cell array region 102 increases. The contact holes CT provided in the second zone PP2 may expose the sacrificial insulating layer 130*s* positioned on a relatively lower portion in a direction away from the cell array region 102. In this case, the length of the contact holes CT provided in the second zone PP2 may be sequentially increases at predetermined intervals. The predetermined intervals may be substantially the same as a distance between adjacent sacrificial insulating layers 130*s*.

Subsequently, the second upper insulating layer 132*b* may be exposed by removing the hard mask HM.

Figure 13:
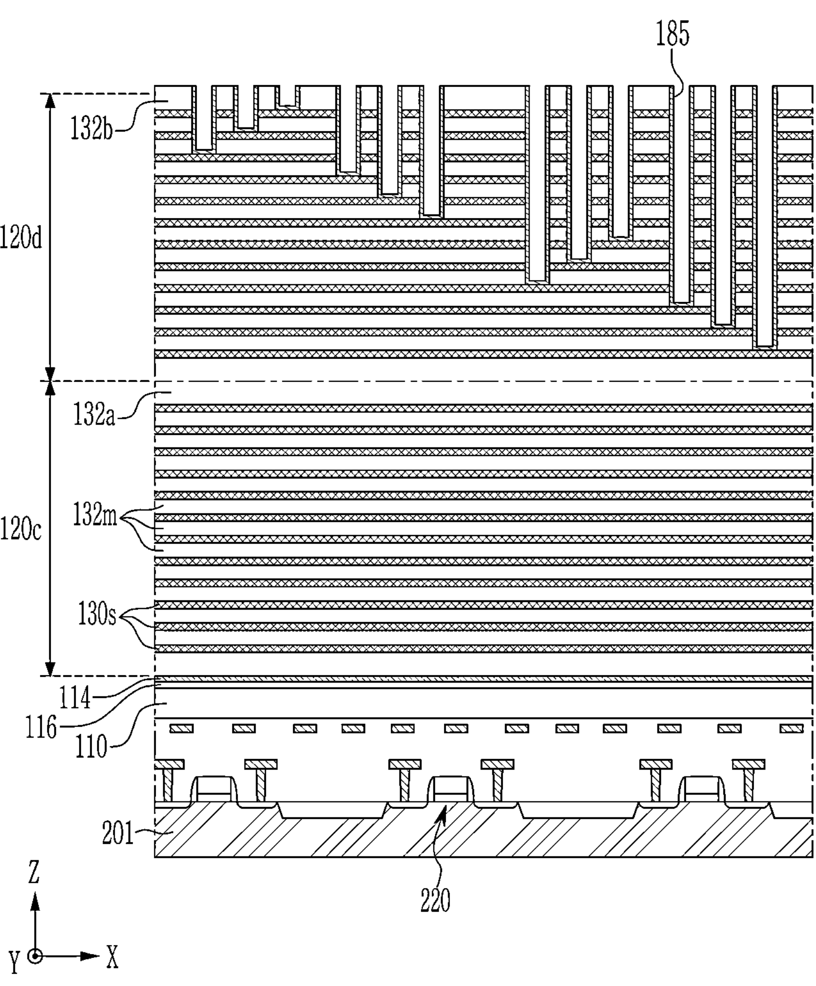

Referring to FIG. 13, gate spacers 185 are positioned on sidewalls and lower surfaces of the contact holes CT. The gate spacers 185 may be formed by depositing an insulating layer on the sidewalls and the lower surfaces of the contact holes CT and anisotropically etching the insulating layer. The gate spacers 185 may be formed in all the contact holes CT together, but the example embodiment is not limited thereto. The gate spacers 185 include a material having an etch selectivity with respect to the sacrificial insulating layer 130*s*. The gate spacers 185 may include, e.g., a silicon oxide layer or a silicon nitride layer.

Figure 14:
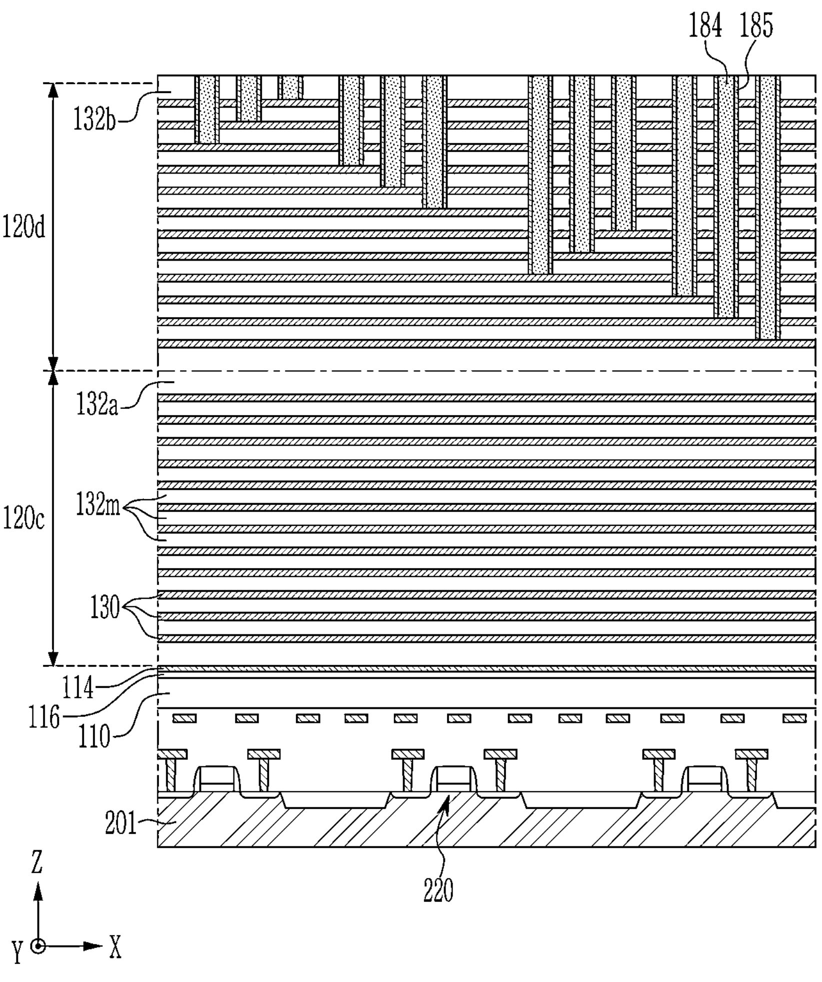

Referring to FIG. 14, the gate electrode 130 may be formed, and the gate contact portions 184 may be formed in the contact holes CTs.

First, the sacrificial insulating layer 130*s* may be removed, and the gate electrode 130 may be filled in the removed space. Specifically, a separation trench exposing entire sidewalls of the sacrificial insulating layer 130*s* and the interlayer insulating layer 132*m* may be formed, and the sacrificial insulating layer 130*s* exposed by the separation trench may be removed. The separation trench may be formed to correspond to a portion where the separation structure 146 is to be formed. The sacrificial insulating layer 130*s* may be selectively removed using an etching solution having an etching selectivity with respect to the interlayer insulating layer 132*m*. In this case, the gate spacers 185 positioned on lower surfaces of the contact holes CT may be exposed.

Subsequently, the gate electrode 130 may be formed in the removed space. The gate electrode 130 may be formed by depositing a conductive material such as tungsten (W), copper (Cu), or aluminum (Al) in a space where the sacrificial insulating layer 130*s* is removed using an etching process.

Next, the gate electrode 130 may be exposed by removing a lower surface of the gate spacer 185. In this case, a process of removing the lower surface of the gate spacer 185 may be performed using dry etching, but the present disclosure is not limited thereto. The gate spacer 185 may include a material having an etch selectivity with respect to the gate electrode 130. As the lower surface of the gate spacer 185 is removed, the gate electrode 130 may be exposed.

Subsequently, the gate contact portions 184 connected to each gate electrode 130 may be formed. The gate contact portions 184 may be formed by depositing a conductive material on the contact holes CT. Accordingly, the lower surface of the gate spacer 185 may be aligned with lower surfaces of the gate contact portions 184 at a same boundary. That is, the lower surface of the gate spacer and the lower surfaces of the gate contact portions 184 may be positioned at substantially a same level. Lower surfaces of the gate contact portions 184 may be connected (e.g., contacted) to the gate electrode 130 as a whole.

In accordance with a manufacturing method of a semiconductor device according to an example embodiment of the present disclosure, the preliminary contact groups CPG having symmetric connection structures may be formed together in each of the zones PP1 and PP2 by sequentially expanding the open portion of the first mask pattern M1. Accordingly, the process may be easily controlled and simplified.

In addition, the preliminary contact group CPG formed in each of the zones PP1 and PP2 may be etched together for each zone unit by sequentially expanding the open portion of the second mask pattern M2 in each of the zones PP1 and PP2. Accordingly, contact holes CT having a same connection structure are formed in each of the areas A1 and A2, thereby reducing an error margin between the contact holes CT and improving dispersion. Accordingly, reliability and productivity of the semiconductor device 10 may be improved.

Next, a semiconductor device according to an additional example embodiment will be described with reference to FIG. 15.

Figure 15:
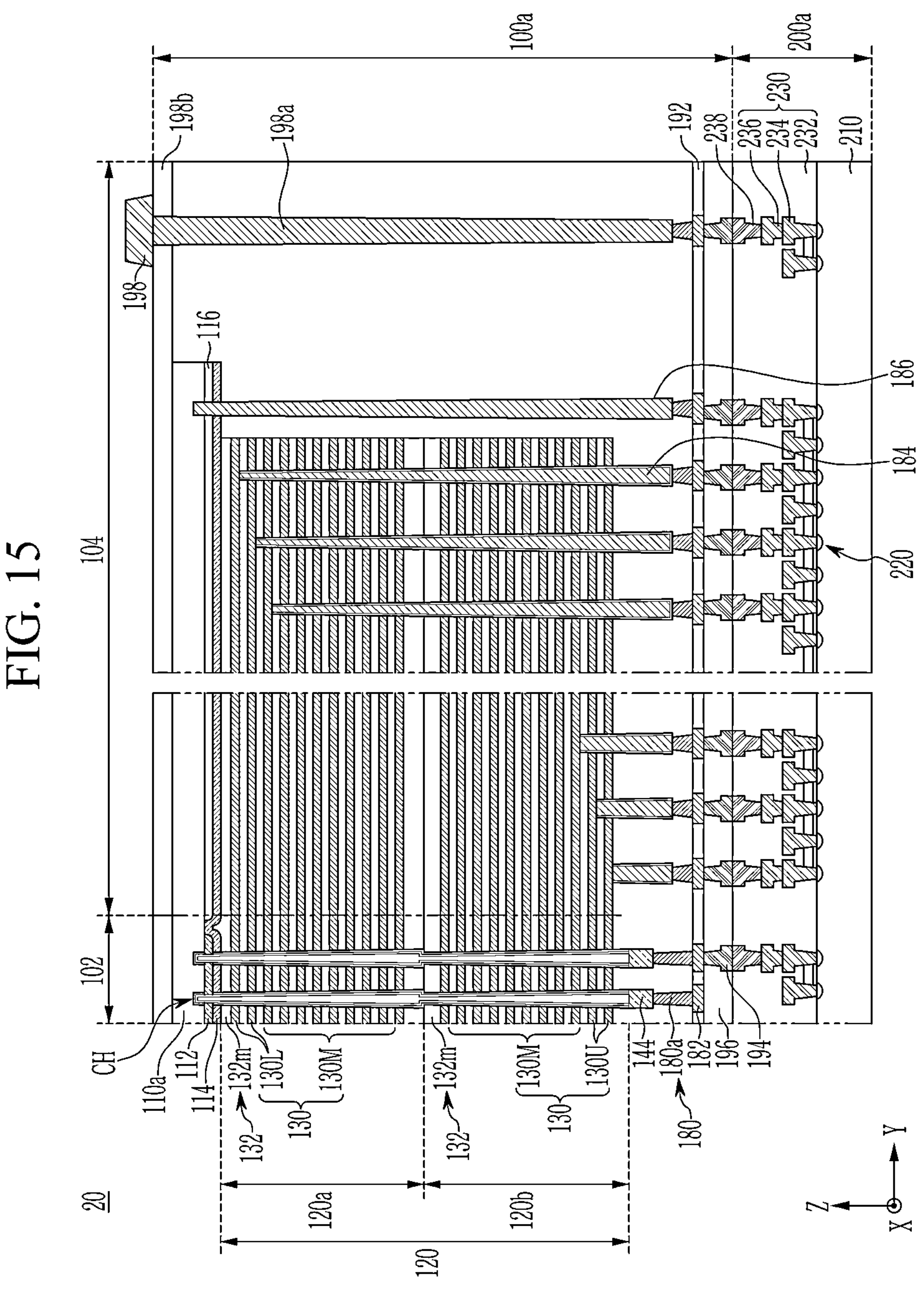
FIG. 15 illustrates a cross-sectional view showing a semiconductor device according to another example embodiment.

FIG. 15 illustrates a cross-sectional view showing a semiconductor device according to the additional example embodiment.

Since the example embodiment illustrated in FIG. 15 is equivalent to the example embodiment illustrated in FIG. 1 to FIG. 4, a description thereof will be omitted and differences therebetween will be mainly described. In addition, same reference numerals are used for same components as in the previous example embodiment.

Referring to FIG. 15, the semiconductor device 20 according to the example embodiment may have a chip to chip (C2C) structure bonded by a wafer bonding method. That is, after manufacturing a lower chip including a circuit region 200*a* positioned on the first substrate 201 and manufacturing the upper chip including a cell region 100*a* positioned on a second substrate 110, the semiconductor device 20 may be manufactured by joining them together.

The circuit region 200*a* may have a first junction structure 238 on a surface facing the cell region 100*a* on the first substrate 201, the circuit element 220, and the first wire portion 240.

The cell region 100*a* may include a second junction structure 194 on a surface facing the circuit region 200*a* on the second substrate 110, the gate stack structure 120, the channel structure CH, and the second wire portion 180.

In the gate stack structure 120, the gate electrode 130 may include the lower gate electrode 130L, the memory cell gate electrode 130M, and the upper gate electrode 130U sequentially positioned on the second substrate 110 toward the circuit region 200*a* from the second substrate 110. That is, as illustrated in FIG. 15, the gate stack structure 120 may be sequentially stacked on a lower portion of the second substrate 110 in the drawing, and thus the gate stack structure 120 illustrated in FIG. 1 to FIG. 4 may be positioned in a vertically inverted manner.

Accordingly, the channel pad 144 and the second wire portion 180 positioned on the gate stack structure 120 may be positioned adjacent to the circuit region 200*a*. In addition, the second junction structure 194 electrically connected to the second wire portion 180 may be provided on a surface facing the circuit region 200*a*. A region other than the second junction structure 194 may be covered by an insulating layer 196. As such, in the cell region 100*a*, the second wire portion 180 and the second junction structure 194 may be positioned to face the circuit region 200*a*.

For example, the second junction structure 194 of the cell region 100*a* and the first junction structure 238 of the circuit region 200*a* may be made of aluminum, copper, tungsten, or an alloy including the same. For example, since the first and second junction structure 238 and 194 include copper, the cell region 100*a* and the circuit region 200*a* may be bonded by copper-to-copper bonding (directly contacted and bonded).

Although FIG. 15 illustrates that the gate stack structure 120 includes a plurality of gate structures 120*a* and 120*b*, the gate stack structure 120 may include a single gate stack structure. Except as otherwise described, descriptions of the structures of the gate stack structure 120 and the channel structure CH described with reference to FIG. 1 to FIG. 4 may be applied as they are. In FIG. 15, a same electrical connection structure between the channel structure CH and the horizontal conductive layers 112 and 114 and/or the second substrate 110 as in FIG. 1 is illustrated. The example embodiment is not limited thereto, and an electrical connection structure between the channel structure CH and the horizontal conductive layers 112 and 114 and/or the second substrate 110 may be variously changed.

The semiconductor device 20 according to an example may include an input/output pad 198 and an input/output connecting wire 198*a* electrically connected thereto. The input/output connecting wire 198*a* may be electrically connected to a portion of the second junction structure 194. The input/output pad 198 may be positioned on, for example, an insulating layer 198*b* covering an outer surface of the second substrate 110. According to an example embodiment, a separate input/output pad electrically connected to the circuit region 200*a* may be provided.

Figure 18:
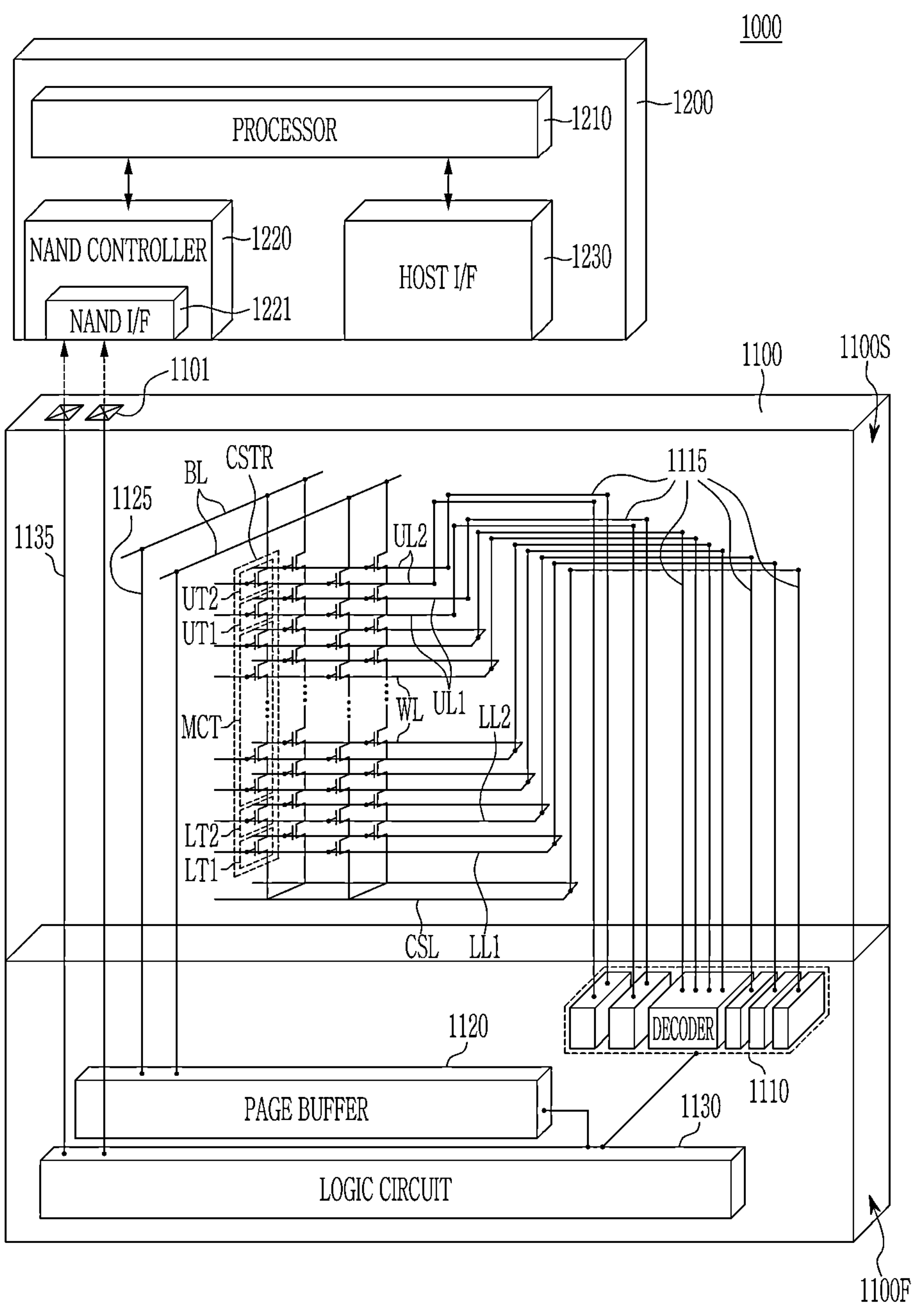
FIG. 18 illustrates a schematic view showing an electronic system including a semiconductor device according to an example embodiment.

For example, the circuit region 200*a* and the cell region 100*a* may respectively be portions corresponding to a first structure 1100F and a second structure 1100S of a semiconductor device 1100 included in an electronic system 1000 illustrated in FIG. 18. Alternatively, the circuit region 200*a* and the cell region 100*a* may be regions corresponding to a first structure 4100 and a second structure 4200 of a semiconductor chip 2200 illustrated in FIG. 21, respectively.

Next, a semiconductor device according to an additional example embodiment will be described with reference to FIG. 16 and FIG. 17. Detailed descriptions of parts identical to or extremely similar to those already described will be omitted, and only other parts will be described in detail.

Figure 16:
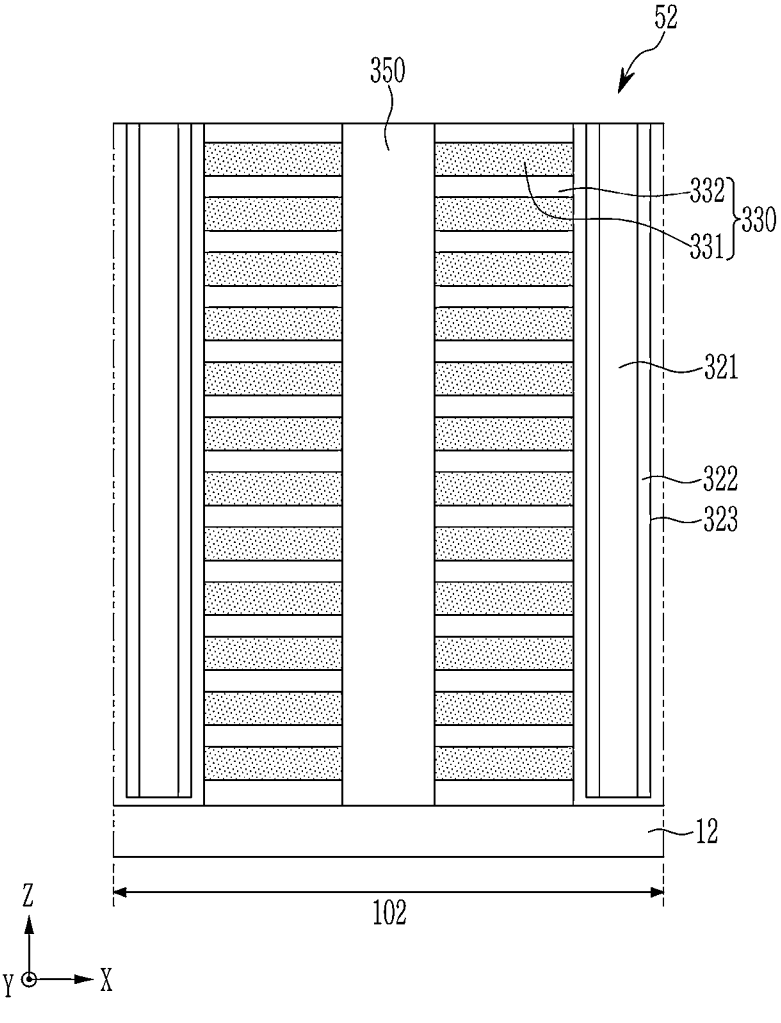
FIG. 16 illustrates a cross-sectional view showing a cell array region of a semiconductor device according to an additional example embodiment.

FIG. 16 illustrates a cross-sectional view showing a cell array region of a semiconductor device according to an additional example embodiment. FIG. 17 illustrates a cross-sectional view showing a connecting region of a semiconductor device according to an additional example embodiment.

Figure 17:
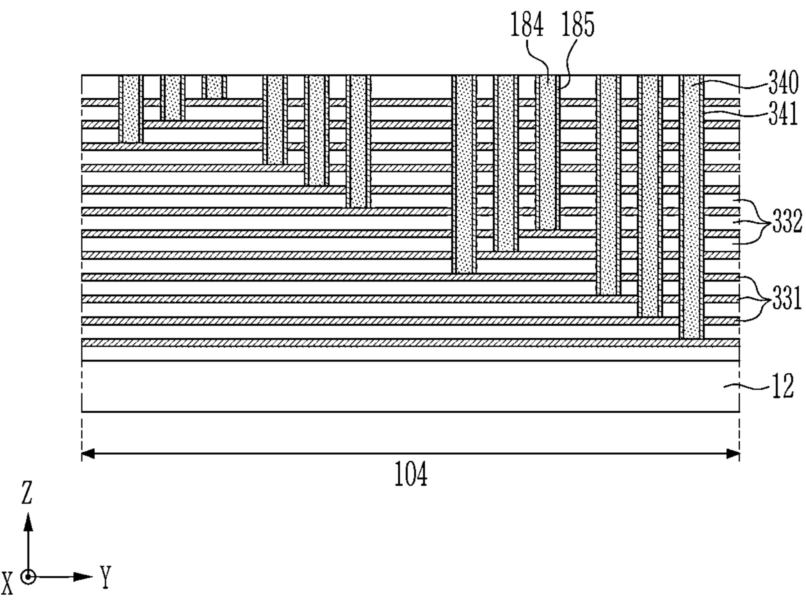
FIG. 17 illustrates a cross-sectional view showing a connecting region of a semiconductor device according to an additional example embodiment.

Referring to FIG. 16 and FIG. 17, the semiconductor device according to some example embodiments may indicate a random access memory. The random access memory may include a memory array 52, a row decoder, and a column decoder.

The memory array 52 may include memory cells, word lines, and bit lines. The memory cells may be arranged in rows and columns. The word lines and the bit lines may be electrically connected to the memory cells. The word line may refer to a conductive line (e.g., a first conductive line 331 of FIG. 16) extending along a row of the memory cells. The bit line may refer to a conductive line (e.g., a second conductive line 321 of FIG. 16) extending along a column of the memory cells.

The row decoder may select a desired memory cell in a row of the memory array 52 by activating the word line for that row. The column decoder may select a bit line for a desired memory cell from a column of the memory array 52 in the selected row, and may use the bit line to read data from or write data to the selected memory cell.

The memory array 52 may include a plurality of memory cells arranged in a matrix form of rows and columns. Since the memory cells may be vertically stacked to form a 3D memory array, a degree of integration of the semiconductor device may be increased. The semiconductor device according to example embodiments may be a 3D nonvolatile memory device.

Each of the memory cells may include a transistor. A gate of each transistor may be electrically connected each word line, a first source/drain region of each transistor may be electrically connected to each bit line, and a second source/drain region of each transistor may be electrically connected to each source line. The memory cells in a same horizontal row of the memory array 52 may share a common word line, and the memory cells in a same vertical column of the memory array 52 may share common source lines and common bit lines.

According to some example embodiments, the semiconductor device may include a substrate 12, an insulating layer 332, a first conductive line 331, a second conductive line 321, a dielectric layer 323, a semiconductor layer 322, a separation layer 350, and a word line contact portion 340.

The substrate 12 may extend in a first direction (X-axis direction) and a second direction (Y-axis direction). The first direction (X-axis direction) and the second direction (Y-axis direction) may indicate directions that are parallel to an upper surface of the substrate 12 and cross each other. The third direction (Z-axis direction) may indicate a direction perpendicular to each of the first direction (X-axis direction) and the second direction (Y-axis direction).

The substrate 12 may include the cell array region 102 in which transistors are positioned and the contact region 104 extending from the cell array region 102 in a direction (e.g., the second direction (Y-axis direction)). In the contact region 104, the first conductive line 331 to be described later may be positioned. Herein, the contact region 104 according to an example embodiment may be a region substantially identical to the contact region 104 of FIG. 1 to FIG. 4.

The substrate 12 may include, e.g., a semiconductor substrate such as a silicon substrate, a germanium substrate, or a silicon-germanium substrate. Alternatively, the substrate 12 may include a silicon-on-insulator (SOI) substrate or a germanium-on-insulator (GOI) substrate.

A third stack structure 330 in which the insulating layer 332 and the first conductive line 331 are alternately stacked in a third direction (Z-axis direction) may be positioned on the substrate 12. The third stack structure 330 may extend on the substrate 12 in the second direction (Y-axis direction). Herein, the third stack structure 330 according to an example embodiment may correspond to the gate stack structure 120 of FIG. 1 to FIG. 4. That is, the insulating layer 332 and the first conductive line 331 according to an example embodiment may respectively correspond to the interlayer insulating layer 132*m* and the gate electrodes 130 in FIG. 1 to FIG. 4.

The second conductive line 321 may extend through the third stack structure 330. For example, the second conductive line 321 may extend in the third direction (Z-axis direction) in a pillar shape. A plurality of second conductive lines 321 may be formed that are spaced apart from each other in the second direction (Y-axis direction). The second conductive line 321 may be spaced apart from the first conductive line 331 in a first direction (X-axis direction).

The semiconductor layer 322 may provide a channel region for a transistor of a memory cell. The semiconductor layer 322 may be disposed on one sidewall of the second conductive line 321, and may extend in the third direction (Z-axis direction). The semiconductor layer 322 may be disposed between the dielectric layer 323 and the second conductive lines 321 along a second direction (Y-axis direction). The semiconductor layer 322 may be, e.g., doped polysilicon, doped silicon, silicon germanium (SiGe), or a semiconductor material formed through selective epitaxial growth (SEG), but the present disclosure is not limited thereto, and may be an oxide semiconductor material.

Each semiconductor layer 322 may provide a planar channel region for a transistor by contacting a side surface of the corresponding first conductive line 331. According to some example embodiments, the semiconductor layer 322 may be formed to contact multiple surfaces of the corresponding first conductive lines 331 so as to provide a 3D channel region for a transistor.

The dielectric layer 323 may be disposed between the first conductive line 331 and the semiconductor layer 322, and may extend in the third direction (Z-axis direction). The dielectric layer 323 may be disposed between one sidewall of the first conductive line 331 and the second conductive line 321 along the first direction (X-axis direction). The dielectric layer 323 may include, e.g., a hafnium oxide, a zirconium oxide, a hafnium zirconium oxide, or a combination thereof. A writing operation may be performed on the memory cell by applying a predetermined voltage to a portion of the dielectric layer 323 corresponding to the memory cell. In addition, a reading operation may be performed on the memory cell by applying a predetermined voltage to a portion of the dielectric layer 323 corresponding to the memory cell.

The separation layer 350 may be disposed between the second conductive lines 321, and may be extended in the third direction (Z-axis direction). The separation layer 350 may be disposed between the second conductive lines 321 along the first direction (X-axis direction). The separation layer 350 may be disposed between adjacent lines among the aforementioned bit lines and source lines to separate them. Word lines, bit lines, and source lines that cross each other may define each memory cell. The separation layer 350 may include a dielectric material such as a silicon oxide, but the present disclosure is not limited thereto.

To connect the third stack structure 330 provided in the cell array region 102 to an external circuit, the connection region 104 and the word line contact portion 340 may be provided.

The third stack structure 330 may extend to the connection region 104. Extended lengths of the third stack structures 330 may be substantially the same. That is, edges of each of the first conductive line 331 and the insulation layer 332 may be aligned on a same boundary. Accordingly, side surfaces of the third stack structures 330 may be aligned in a vertical direction (Z-axis direction in the drawing) perpendicular to the second substrate 110. A description thereof will be omitted since it is substantially the same as the example embodiment of FIG. 1 to FIG. 4.

Each of the word line contact portions 340 in the connection region 104 may extend through the third stack structure 330 in different depths to be connected to the first conductive line 331.

For example, remaining word line contact portions 340 of the word line contact portions 340 may extend through at least a portion of the first conductive lines 331 to be electrically connected to the first conductive line 331 positioned therebelow.

That is, the word line contact portion 340 may extend through the third stack structure 330 in different depths to fill contact holes whose bottom surfaces are defined by upper surfaces of the first conductive lines 331. A lower surface of the word line contact portion 340 may contact a portion of an upper surface of the first conductive line 331. Herein, the word line contact portion 340 according to an example embodiment may correspond to the gate contact portions 184 of FIG. 1 to FIG. 4. A description of a connection structure between the word line contact portion 340 and the first conductive line 331 is substantially the same as that of the example embodiment of FIG. 1 to FIG. 4, and thus will be omitted.

The semiconductor device according to an example embodiment may further include a contact portion spacer 341. Herein, the contact portion spacer 341 according to an example embodiment may correspond to the gate spacer 185 of FIG. 1 to FIG. 4. A description of the contact portion spacer 341 is substantially the same as that of the gate spacer 185 of FIG. 1 to FIG. 4, and thus will be omitted.

Although not illustrated in FIG. 16 and FIG. 17, the semiconductor device according to an example embodiment further includes member electrically connecting the first conductive line 331, the second conductive line 321, and/or the semiconductor layer 322 to a circuit area or an external circuit.

Even in the case of the semiconductor device according to an example embodiment, each of the word line contact portions 340 may be connected to the first conductive line 331 by extending through the third stack structure 330 in different depths. In this case, A process of forming the word line contact portion 340 may be simplified by forming contact holes CT extending through at least a portion of the third stack structure 330 without exposing each of the first conductive lines 331.

In accordance with a manufacturing method of a semiconductor device according to an example embodiment of the present disclosure, the preliminary contact groups CPG having symmetric connection structures may be formed together in each of the zones PP1 and PP2 by sequentially expanding the open portion of the first mask pattern M1. Accordingly, the process may be easily controlled and simplified.

In addition, the preliminary contact group CPG formed in each of the zones PP1 and PP2 may be etched together for each zone unit by sequentially expanding the open portion of the second mask pattern M2 in each of the zones PP1 and PP2. Accordingly, contact holes CT having a same connection structure are formed in each of the areas A1 and A2, thereby reducing an error margin between the contact holes CT and improving dispersion. Accordingly, reliability and productivity of the semiconductor device 10 may be improved.

Next, an electronic system including a semiconductor device according to an example embodiment will be described with reference to FIG. 18.

FIG. 18 illustrates a schematic view showing an electronic system including a semiconductor device according to an example embodiment.

As illustrated in FIG. 18, the electron system 1000 according to an example embodiment may include a semiconductor device 1100 and a controller 1200 electrically connected to the semiconductor device 1100. The electronic system 1000 may be a storage device including one or a plurality of semiconductor devices 1100 or an electronic device including the storage device. For example, the electron system 1000 may be a solid state drive (SSD) device including one or the plurality of semiconductor devices 1100, a universal serial bus (USB), a computing system, a medical device, or a communication device.

The semiconductor device 1100 may be a non-volatile memory device, and may be, for example, a NAND flash memory device described with reference to FIG. 1 to FIG. 15. The semiconductor device 1100 may include a first structure 1100F and a second structure 1100S on the first structure 1100F. In an example embodiment, the first structure 1100F may be positioned next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a word line WL, first and second gate upper lines UL1 and UL2, and first and second gate lower lines LL1 and LL2, and a memory cell string CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT positioned between the lower transistors LT1 and LT2 and the upper transistors UT1 and UT2. A number of lower transistors LT1 and LT2 and a number of upper transistors UT1 and UT2 may be variously changed according to another example embodiment.

In an example embodiment, the lower transistors LT1 and LT2 may include ground selective transistors, and the upper transistors UT1 and UT2 may include string selective transistors. The first and second gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2, respectively.

The common source line CSL, the first and second gate lower lines LL1 and LL2, the word line WL, and the first and second gate upper lines UL1 and UL2 may be electrically connected to the decoder circuit 1110 through a first connecting wire 1115 extending from the first structure 1100F to the second structure 1100S. The bit line BL may be electrically connected to the page buffer 1120 through a second connecting wire 1125 extending to the second structure 1100S in the first structure 1100F.

In the first structure 1100F, the decoder circuit 1110 and the page buffer 1120 may execute a control operation on at least one memory cell transistor selected from among the memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connecting wire 1135 extending from the first structure 1100F to the second structure 1100S.

The controller 1200 may include a processor 1210, a NAND controller 1220, and a host interface 1230. According to another example embodiment, the electronic system 1000 may include a plurality of semiconductor devices 1100, and in this case, the controller 1200 may control the semiconductor devices 1100.

The processor 1210 may control an overall operation of the electron system 1000 including the controller 1200. The processor 1210 may operate according to predetermined firmware, and may access the semiconductor devices 1100 by controlling the NAND controller 1220. The NAND controller 1220 may include a NAND interface 1221 that processes communication with the semiconductor devices 1100. A control command for controlling the semiconductor device 1100, data to be recorded in the memory cell transistor MCT of the semiconductor device 1100, and data to be read from the memory cell transistor MCT of the semiconductor device 1100 may be transmitted through the NAND interface 1221. The host interface 1230 may provide a communication function between the electronic system 1000 and an external host. When a control command is received from an external host through the host interface 1230, the processor 1210 may control the semiconductor devices 1100 in response to the control command.

Figure 19:
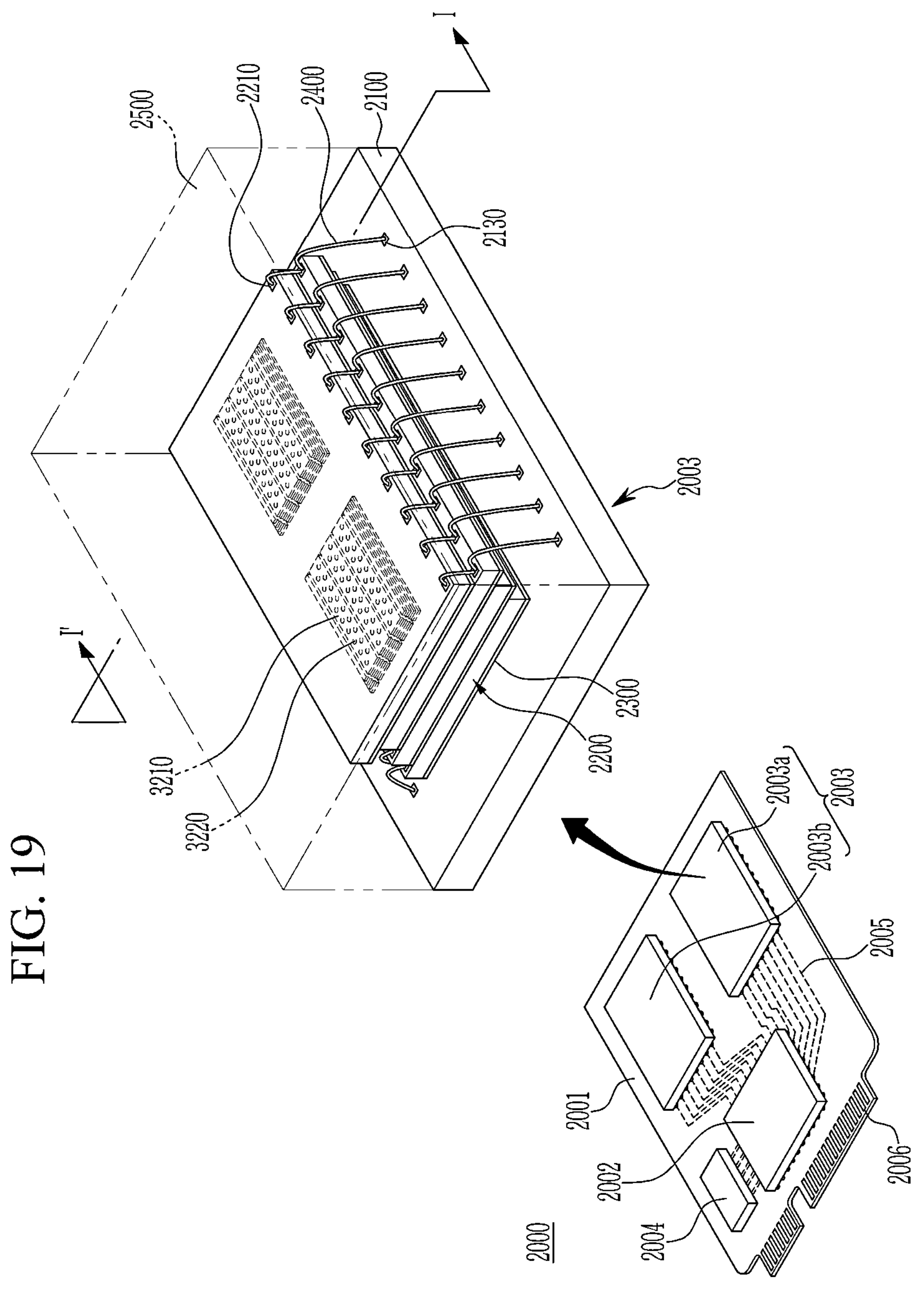
FIG. 19 illustrates a schematic perspective view showing an electronic system including a semiconductor device according to an example embodiment.

FIG. 19 illustrates a schematic perspective view showing an electronic system including a semiconductor device according to an example embodiment.

As illustrated in FIG. 19, an electronic system 2000 according to an example embodiment includes a main substrate 2001, a controller 2002 mounted on the main substrate 2001, one or more semiconductor packages 2003, and a DRAM 2004. The semiconductor package 2003 and the DRAM 2004 may be connected to the controller 2002 through a wire pattern 2005 positioned on the main substrate 2001.

The main substrate 2001 may include a connector 2006 including a plurality of pins coupled to an external host. A number and disposition of the pins in the connector 2006 may vary depending on a communication interface between the electronic system 2000 and the external host. In an example embodiment, the electronic system 2000 may communicate with the external host according to any one of interface such as a universal flash storage (USB), a peripheral component interconnect express (PCI-Express), a serial advanced technology attachment (SATA), M-Phy for universal flash storage (UFS), and the like. In an example embodiment, the electronic system 2000 may operate with power supplied from an external host through the connector 2006. The electronic system 2000 may further include a power management integrated circuit (PMIC) that distributes power supplied from the external host to the controller 2002 and semiconductor package 2003.

The controller 2002 may record data in the semiconductor package 2003, or may read data from the semiconductor package 2003, and may improve an operation speed of the electronic system 2000.

The DRAM 2004 may be a buffer memory for buffering a speed difference between the semiconductor package 2003, which is a data storage space, and an external host. The DRAM 2004 included in the electronic system 2000 may also operate as a kind of cache memory, and may provide a space for temporarily storing data in the control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may be semiconductor packages each including a plurality of semiconductor chips 2200. Each of the first and second semiconductor packages 2003*a* and 2003*b* may include a package substrate 2100, a semiconductor chip 2200 on the package substrate 2100, an adhesive layer 2300 disposed on a lower surface of each semiconductor chip 2200, a connecting structure 2400 that electrically connects the semiconductor chip 2200 and the package substrate 2100, and a molding layer 2500 covering the semiconductor chip 2200 and the connection structure 2400 on the package substrate 2100.

The package substrate 2100 may be a printed circuit board including a package upper pad 2130. Each semiconductor chip 2200 may include an input/output pad 2210. The input/output pad 2210 may correspond to the input/output pad 1101 of FIG. 18. Each semiconductor chip 2200 may include a gate stack structure 3210 and a channel structure 3220. The semiconductor chip 2200 may include the semiconductor device described with reference to FIG. 1 to FIG. 15.

In some example embodiments, the connecting structure 2400 may be a bonding wire electrically connecting the input/output pad 2210 and the package upper pad 2130. Accordingly, the semiconductor chips 2200 may be electrically connected to each other by using a bonded wire method, and may be electrically connected to the package upper pad 2130 of the package substrate 2100 in each of the first and second semiconductor packages 2003*a* and 2003*b*. According to an example embodiment, the semiconductor chips 2200 may be electrically connected to each other by a connecting structure including a through silicon via (TSV) instead of the bonding wire connecting structure 2400 in each of the first and second semiconductor packages 2003*a* and 2003*b*.

In an example embodiment, the controller 2002 and the semiconductor chip 2200 may be included in one package. For example, the controller 2002 and the semiconductor chip 2200 may be mounted on a separate interposer substrate that is different from the main substrate 2001, and the controller 2002 and the semiconductor chip 2200 may be connected to each other by a wire positioned on the interposer substrate.

Figure 20:
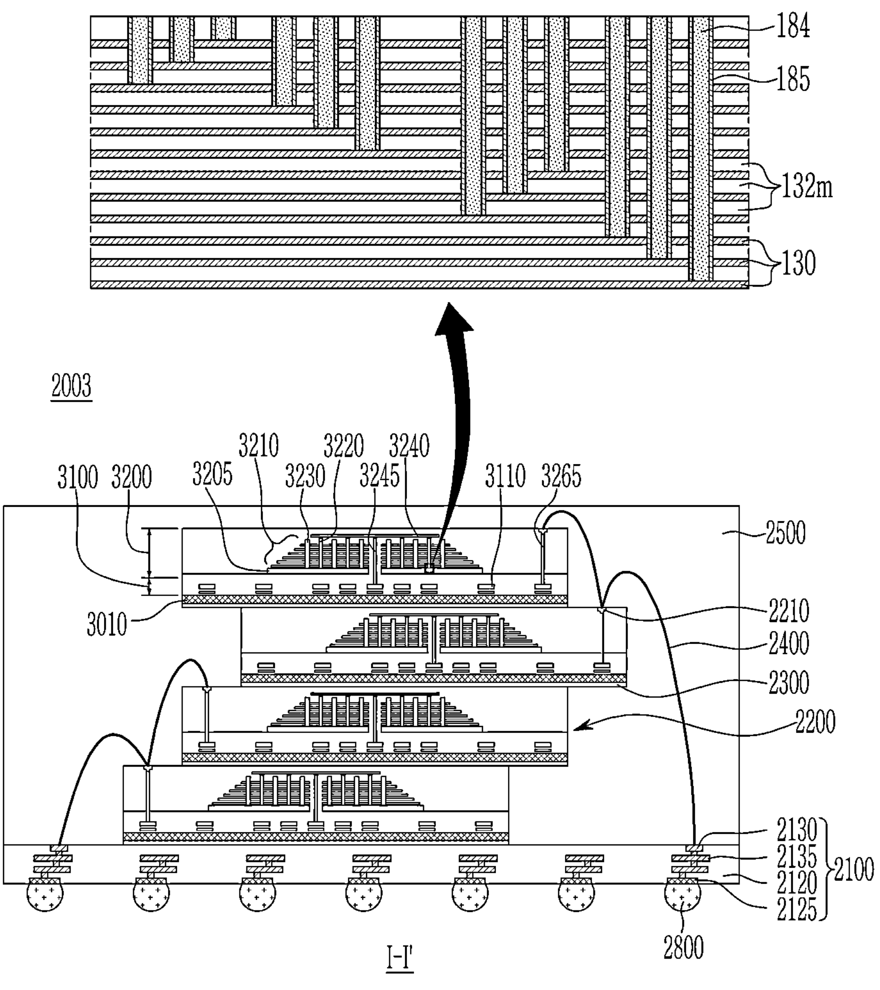
FIG. 20 and FIG. 21 each illustrate a schematic cross-sectional view showing a semiconductor package according to an example embodiment.
Figure 21:
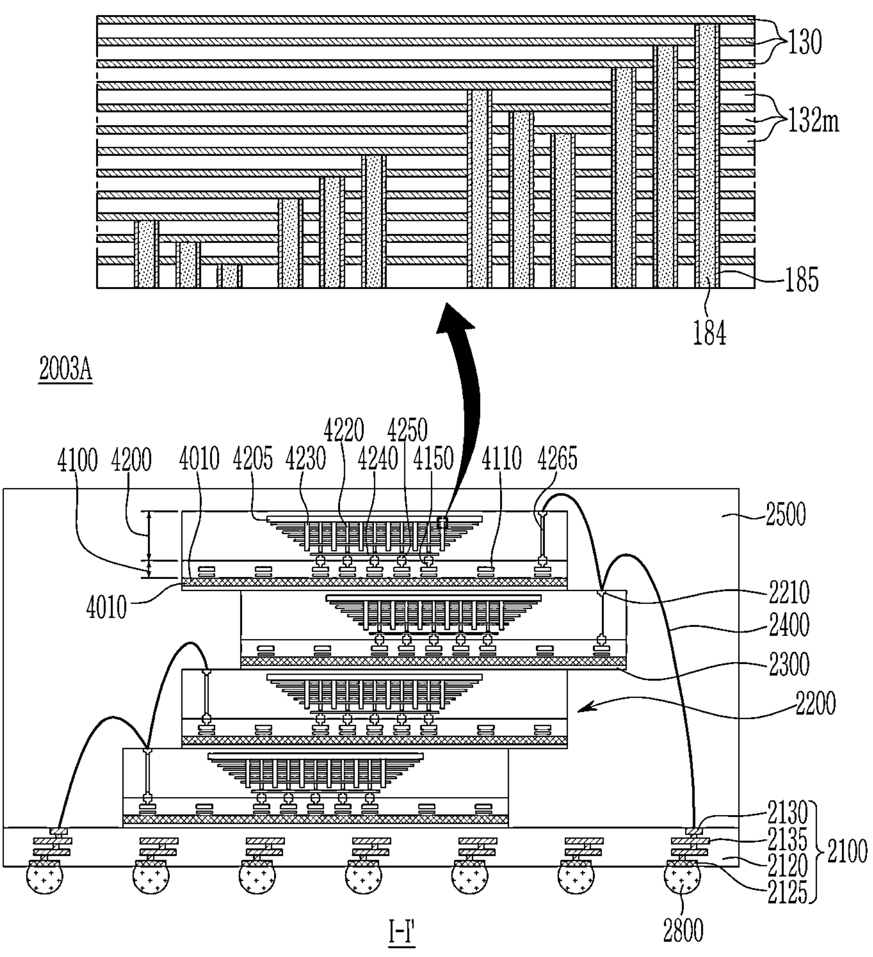

FIG. 20 and FIG. 21 each illustrate a schematic cross-sectional view showing a semiconductor package according to an example embodiment. FIG. 20 and FIG. 21 each illustrate an example embodiment of the semiconductor package 2003 of FIG. 19, and conceptually illustrates an area of the semiconductor package 2003 of FIG. 19 taken along a line I-I'.

Referring to FIG. 20, in the semiconductor package 2003, the package substrate 2100 may be a printed circuit board. The package substrate 2100 may include a package substrate body 2120, a package upper pad 2130 positioned on an upper surface of the package substrate body 2120, a lower pad 2125 positioned on a surface of the package substrate body 2120, and an inner wire 2135 that electrically connects the upper pad 2130 and the lower pad 2125 inside the package substrate body 2120. The upper pad 2130 may be electrically connected to the connecting structure 2400. The lower pad 2125 may be connected to the wire pattern 2005 of the main substrate 2001 of the electronic system 2000 through a conductive connector 2800 as illustrated in FIG. 19.

The semiconductor chip 2200 may each include a semiconductor substrate 3010, and a first structure 3100 and a second structure 3200 stacked in turn on the semiconductor substrate 3010. The first structure 3100 may include a peripheral circuit region including a peripheral wire 3110. The second structure 3200 may include a common source line 3205, a gate stack structure 3210 on the common source line 3205, a channel structure 3220 and a separating structure 3230 through the gate stack structure 3210, a bit line 3240 electrically connected to the channel structure 3220, and a gate connecting wire electrically connected to a word line WL (see FIG. 18) of the gate stack structure 3210.

In the semiconductor chip 2200 or the semiconductor device according to an example embodiment, the preliminary contact groups CPG having symmetric connection structures may be formed together in each of the zones PP1 and PP2 by sequentially expanding the open portion of the first mask pattern M1. Accordingly, the process may be easily controlled and simplified.

In addition, the preliminary contact group CPG formed in each of the zones PP1 and PP2 may be etched together for each zone unit by sequentially expanding the open portion of the second mask pattern M2 in each of the zones PP1 and PP2. Accordingly, contact holes CT having a same connection structure are formed in each of the areas A1 and A2, thereby reducing an error margin between the contact holes CT and improving dispersion. Accordingly, reliability and productivity of the semiconductor device 10 may be improved.

Each of the semiconductor chips 2200 may include a through wire 3245 that is electrically connected to the peripheral wire 3110 of the first structure 3100 and extends into the second structure 3200. The through wire 3245 may extend through the gate stack structure 3210, and may be further positioned outside the gate stack structure 3210. Each semiconductor chip 2200 may further include an input/output connection wire 3265 electrically connected to the peripheral wire 3110 of the first structure 3100 and an input/output pad 2210 electrically connected to the input/output connecting wire 3265 extending into the second structure 3200.

In an example embodiment, a plurality of semiconductor chips 2200 in the semiconductor package 2003 may be electrically connected to each other by a connecting structure 2400 having a form of a bonding wire. As another example, the semiconductor chips 2200 or a plurality of portions constituting the semiconductor chips 2200 may be electrically connected by a connecting structure including a through silicon via (TSV).

Referring to FIG. 21, in a semiconductor package 2003A, each semiconductor chip 2200 may include a semiconductor substrate 4010, a first structure 4100 on the semiconductor substrate 4010, and a second structure 4200 bonded to a first structure 4100 by wafer bonding on the first structure 4100.

The first structure 4100 may include a peripheral circuit region including a peripheral wire 4110 and a first junction structure 4150. The second structure 4200 may include a common source line 4205, a gate stack structure 4210 between the common source line 4205 and the first structure 4100, a channel structure 4220 and a separating structure 4230 extending through the gate stack structure 4210, and a second junction structure 4250 electrically connected to the word line (reference numeral WL in FIG. 18, hereinafter the same) of each of the channel structure 4220 and the gate stack structure 4210. For example, the second junction structure 4250 may be electrically connected to the channel structure 4220 and the word line WL through a bit line 4240 electrically connected to the channel structure 4220 and a gate connecting wire electrically connected to the word line WL, respectively. The first junction structure 4150 of the first structure 4100 and the second junction structure 4250 of the second structure 4200 may be bonded while contacting each other. A bonded portion of the first junction structure 4150 and the second junction structure 4250 may be formed of, e.g., copper (Cu).

In the semiconductor chip 2200 or the semiconductor device according to an example embodiment, the preliminary contact groups CPG having symmetric connection structures may be formed together in each of the zones PP1 and PP2 by sequentially expanding the open portion of the first mask pattern M1. Accordingly, the process may be easily controlled and simplified.

In addition, the preliminary contact group CPG formed in each of the zones PP1 and PP2 may be etched together for each zone unit by sequentially expanding the open portion of the second mask pattern M2 in each of the zones PP1 and PP2. Accordingly, contact holes CT having a same connection structure are formed in each of the areas A1 and A2, thereby reducing an error margin between the contact holes CT and improving dispersion. Accordingly, reliability and productivity of the semiconductor device 10 may be improved.

Each of the semiconductor chips 2200 may further include an input/output pad 2210 and an input/output connecting wire 4265 under the input/output pad 2210. The input/output connecting wire 4265 may be electrically connected to a portion of the second junction structure 4250.

In an example embodiment, a plurality of semiconductor chips 2200 in the semiconductor package 2003A may be electrically connected to each other by a connecting structure 2400 having a form of a bonding wire. As another example, the semiconductor chips 2200 or a plurality of portions constituting the semiconductor chips 2200 may be electrically connected by a connecting structure including the through silicon via (TSV).

While this disclosure has been described in connection with what is presently considered to be practical example embodiments, it is to be understood that the invention is not limited to the disclosed example embodiments, but, on the contrary, is intended to cover various modifications and equivalent dispositions included within the spirit and scope of the appended claims.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

What is claimed is:

1. A semiconductor device comprising:

a substrate configured to include a cell array region and a contact region;

a gate stack structure configured to include a plurality of gate electrodes constituting a plurality of electrode groups sequentially stacked on the substrate and insulated by an interlayer insulating layer;

a channel structure configured to extend in a direction crossing the substrate through the gate stack structure in the cell array region; and a plurality of gate contact portions connected to respective ones of the gate electrodes in the contact region, wherein at least some of the gate contact portions extend through a through gate electrode that is at least one of the gate electrodes and is connected to a connection gate electrode at a lower end portion, and the gate contact portions include a plurality of contact groups extending from a first side to a second side of the gate electrodes in an extending direction, and wherein each of the electrode groups includes a lower group and an upper group on the lower group, each of the contact groups includes a first group connected to the upper group and a second group on the second side in the extending direction and connected to the lower group, and a number of layers of the connection gate electrodes to which the gate contact portions are connected sequentially increases as a distance from a boundary between the first group and the second group increases in the first group and the second group.

2. The semiconductor device of claim 1, wherein a connection structure between the upper group and the first group and a connection structure between the lower group and the second group have symmetrical structures to each other.

3. The semiconductor device of claim 2, wherein numbers of the gate contact portions provided in the first group and the second group are equal to each other, and differences in the numbers of layers of the connection gate electrodes connected to the gate contact portions are the same in the first group and the second group.

4. The semiconductor device of claim 1, wherein the electrode groups include a first electrode group and a second electrode group below the first electrode group, the contact groups include a first contact group connected to the first electrode group and a second contact group connected to the second electrode group, and a connection structure between the first electrode group and the first contact group and a connection structure between the second electrode group and the second contact group are identical to each other.

5. The semiconductor device of claim 4, wherein the first contact group is at a first side in the extending direction, and the second contact group is at a second side in the extending direction.

6. The semiconductor device of claim 5, wherein numbers of the gate contact portions provided in the first contact group and the second contact group are equal to each other, and differences in the numbers of layers of the connection gate electrodes connected to the gate contact portions are the same in the first electrode group and the second electrode group.

7. The semiconductor device of claim 1, wherein the number of connection gate electrode layers to which the gate contact portions are connected is smaller in the second group than in the first group.

8. The semiconductor device of claim 1, further comprising a gate spacer between the through gate electrode and the gate contact portions.

9. The semiconductor device of claim 8, wherein lower surfaces of the gate contact portions are aligned at a same boundary as a lower surface of the gate spacer.

10. The semiconductor device of claim 1, wherein

Side surfaces of the gate stack structure are aligned in a direction perpendicular to the substrate.

11. The semiconductor device of claim 1, wherein a length of the gate contact portions provided in the first group sequentially decrease as a distance from the cell array region increases, and a length of the gate contact portions provided in the second group sequentially increase as the distance from the cell array region increases.

12. The semiconductor device of claim 11, wherein a length of any one of the gate contact portions provided in the second group is greater than a length of each of the gate contact portions provided in the first group.

13. The semiconductor device of claim 1, wherein a minimum distance between the gate contact portions included in the first group and the gate contact portions included in the second group is greater than a minimum distance between the gate contact portions included in the second group.

14. An electronic system comprising:

a main substrate;

a semiconductor device on the main substrate; and a controller electrically connected to the semiconductor device on the main substrate, wherein the semiconductor device includes a circuit region configured to include a peripheral circuit structure and a cell region on the circuit region and configured to include a cell array region and a contact region, and includes:

a substrate configured to include a cell array region and a contact region;

a gate stack structure configured to include a plurality of gate electrodes constituting a first electrode group and a second electrode group sequentially stacked on the substrate and insulated by an interlayer insulating layer;

a channel structure configured to extend in a direction crossing the substrate through the gate stack structure in the cell array region; and a plurality of gate contact portions connected to respective gate electrodes in the contact region, at least some of the gate contact portions extend through a through gate electrode that is at least one of the gate electrodes and is connected to a connection gate electrode at a lower end portion, and the gate contact portions include a plurality of contact groups extending from a first side to a second side of the gate electrodes in an extending direction, and wherein each of the electrode groups includes a lower group and an upper group on the lower group, each of the contact groups includes a first group connected to the upper group and a second group on the second side in the extending direction and connected to the lower group, and a number of layers of the connection gate electrodes to which the gate contact portions are connected sequentially increases as a distance from a boundary between the first group and the second group increases in the first group and the second group.

15. The electronic system of claim 14, wherein the electrode groups include a first electrode group and a second electrode group below the first electrode group, the contact groups include a first contact group connected to the first electrode group and a second contact group connected to the second electrode group, and a connection structure between the first electrode group and the first contact group and a connection structure between the second electrode group and the second contact group are identical to each other.

16. The electronic system of claim 15, wherein numbers of the gate contact portions provided in the first contact group and the second contact group are equal to each other, and differences in the numbers of layers of the connection gate electrodes connected to the gate contact portions are the same in the first electrode group and the second electrode group.

17. The electronic system of claim 14, wherein a connection structure between the upper group and the first group and a connection structure between the lower group and the second group have symmetrical structures to each other.

18. The electronic system of claim 17, wherein numbers of the gate contact portions provided in the first group and the second group are equal to each other, and differences in the numbers of layers of the connection gate electrodes connected to the gate contact portions are the same in the first group and the second group.

* * * * *